(12) United States Patent
Huang

(10) Patent No.: US 11,171,232 B2
(45) Date of Patent: Nov. 9, 2021

(54) HIGH VOLTAGE DEVICE AND MANUFACTURING METHOD THEREOF

(71) Applicant: RICHTEK TECHNOLOGY CORPORATION, Zhubei (TW)

(72) Inventor: Tsung-Yi Huang, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 68 days.

(21) Appl. No.: 16/711,383

(22) Filed: Dec. 11, 2019

(65) Prior Publication Data

US 2020/0220005 A1 Jul. 9, 2020

(30) Foreign Application Priority Data

Jan. 8, 2019 (TW) .................. 108100632

(51) Int. Cl.
*H01L 29/78* (2006.01)
*H01L 29/66* (2006.01)
*H01L 29/06* (2006.01)
*H01L 29/08* (2006.01)
*H01L 29/10* (2006.01)

(52) U.S. Cl.
CPC ........ *H01L 29/782* (2013.01); *H01L 29/1095* (2013.01); *H01L 29/66143* (2013.01); *H01L 29/66681* (2013.01)

(58) Field of Classification Search
CPC ......... H01L 29/06; H01L 29/08; H01L 29/66; H01L 29/78; H01L 29/1095; H01L 29/782; H01L 29/66143; H01L 29/66681; H01L 29/66689; H01L 29/0692; H01L 29/0696; H01L 29/872; H01L 29/873
USPC ......................................... 257/337
See application file for complete search history.

(56) References Cited

U.S. PATENT DOCUMENTS

2013/0168767 A1* 7/2013 Lin .................. H01L 27/0727
257/337

* cited by examiner

*Primary Examiner* — Fazli Erdem
(74) *Attorney, Agent, or Firm* — Tung & Associates

(57) ABSTRACT

A high voltage device for use as a lower switch in a power stage of a switching regulator includes at least one lateral diffused metal oxide semiconductor (LDMOS) device and at least one Schottky barrier diode (SBD). The LDMOS device includes: a well, a body region, a gate, a source, and a drain. The SBD includes a Schottky metal layer and a Schottky semiconductor layer. The Schottky metal layer is electrically connected to the source, and the Schottky semiconductor layer is in contact with the well.

18 Claims, 18 Drawing Sheets

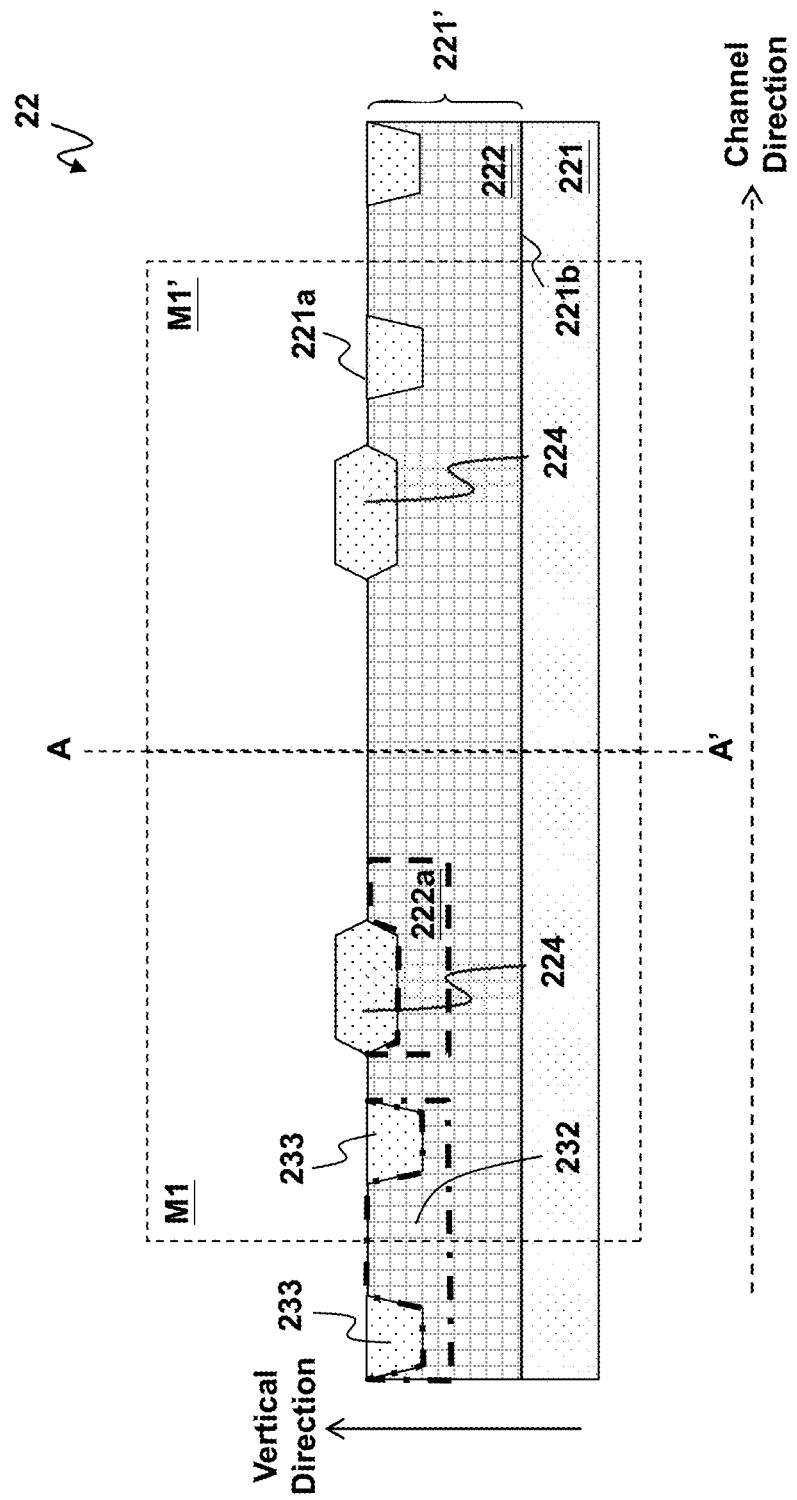

HIGH VOLTAGE DEVICE AND MANUFACTURING METHOD THEREOF

CROSS REFERENCE

The present invention claims priority to TW 108100632, filed on Jan. 8, 2019.

BACKGROUND OF THE INVENTION

Field of Invention

The present invention relates to a high voltage device and a manufacturing method thereof; particularly, it relates to such high voltage device which has an increased operation speed and an increased safe operation area (SOA), and a manufacturing method thereof.

Description of Related Art

FIG. 1A shows a schematic diagram of a typical switching regulator 10. The switching regulator 10 includes a control circuit 1 and a power stage circuit 2. The power stage circuit 2 has a high voltage device 11 as a high-side switch and a high voltage device 12 as a low-side switch as shown in the figure. The high-side switch and the low-side switch operate according to a high-side signal UG and a low-side signal LG respectively, to convert an input voltage Vin to an output voltage Vout for supplying electrical power to the load circuit 3, and to generate an inductor current IL flowing through an inductor 13 in the power stage circuit 2.

FIG. 1B shows a schematic diagram of a cross-section view of the high voltage device 12 as the low-side switch. In the context of the present invention, a "high voltage" device refers a device which needs to withstand a voltage over 5V on a drain thereof in normal operation. Typically, the high voltage device 12 has a drift region 122a between a drain 129 and a body region 125 (as indicated by the dashed frame shown in FIG. 1B), which separates the drain 129 and the body region 125, wherein a lateral length of the drift region 122a is determined according to a maximum voltage that the high voltage device 12 is designed to operate by. As shown in FIG. 1B, the high voltage device 12 includes a well 122, a drift oxide region 124, a body region 125, a body contact 126, a gate 127, a source 128, and a drain 129. The well 122 has a conductivity type of N-type, which is formed on the substrate 121. The gate 127 overlays part of the drift oxide region 124.

In the operation of the high voltage device 12, due to continuity of the inductor current IL flowing through the inductor 13, when the low-side switch is turned OFF in a dead time, a parasitic diode thereof (as indicated by a dashed symbol of a diode) which is formed by the body region 125 and the well 122 is conductive, and a phase node voltage LX of the phase node PH is lower than the ground level GND by a forward voltage of the parasitic diode LD. As thus, a reverse recovery time (trr) of the parasitic diode which is formed by the body region 125 and the well 122, limits the operation speed of the high voltage device 12, and also restricts the safe operation area (SOA).

In view of above, to overcome the drawbacks in the prior art, the present invention proposes a high voltage device which has an increased operation speed and an increased safe operation area (SOA), and a manufacturing method thereof.

SUMMARY OF THE INVENTION

From one perspective, the present invention provides a high voltage device configured to be used as a low-side switch in a power stage of a switching regulator, the high voltage device comprising: at least one lateral diffused metal oxide semiconductor (LDMOS) device, wherein the LDMOS device includes: a well, which has a first conductivity type, and is formed in a semiconductor layer; a body region, which has a second conductivity type, and is formed in the well; a gate, which is formed on the well and is connected to the well; and a source and a drain, which have the first conductivity type, and are located at different sides out of the gate respectively, wherein the source is located in the body region, and the drain is located in the well; and at least one Schottky barrier diode (SBD), wherein the SBD includes: a Schottky metal layer, which is formed on the semiconductor layer, and is electrically connected to the source; and a Schottky semiconductor layer, which is formed in the semiconductor layer, and is in contact with the well, wherein the Schottky semiconductor layer and the Schottky metal layer form a Schottky contact; wherein part of the body region, which is between a boundary thereof and the source, and is right below the gate, forms an inversion region which serves as an inversion current channel in an ON operation of the LDMOS device; wherein part of the well between the body region and the drain is a drift region, which serves as a drift current channel in the ON operation of the LDMOS device.

From another perspective, the present invention provides a manufacturing method of a high voltage device, wherein the high voltage device is configured to be used as a low-side switch in a power stage of a switching regulator, the manufacturing method comprising: forming at least one lateral diffused metal oxide semiconductor (LDMOS) device, by manufacturing steps including: forming a well in a semiconductor layer, wherein the well has a first conductivity type; forming a body region in the well, wherein the body region has a second conductivity type; forming a gate on the well and in contact with the well; and forming a source and a drain having the first conductivity, wherein the source and the drain are located at different sides out of the gate respectively, wherein the source is located in the body region, and the drain is located in the well; and forming at least one Schottky barrier diode (SBD), by manufacturing steps including: forming a Schottky metal layer on the semiconductor layer, wherein the Schottky metal layer is electrically connected to the source; and forming a Schottky semiconductor layer in the semiconductor layer, wherein the Schottky semiconductor layer is in contact with the well, wherein the Schottky semiconductor layer and the Schottky metal layer form a Schottky contact; wherein part of the body region, which is between a boundary thereof and the source, and is right below the gate, forms an inversion region which serves as an inversion current channel in an ON operation of the LDMOS device; wherein part of the well between the body region and the drain is a drift region, which serves as a drift current channel in the ON operation of the LDMOS device.

In one preferable embodiment, the high voltage device includes layout mirroring a basis unit, wherein the basis unit includes: at least part of the SBD; and at least part of the LDMOS device.

In one preferable embodiment, the high voltage device includes plural LDMOS devices and the basis unit includes a power device string formed by parts of the plural LDMOS devices, wherein the plural parts of the LDMOS devices are arranged by mirrored layout and connected in series in a channel direction, and wherein the SBD is in contact with the power device string in the channel direction.

In one preferable embodiment, the high voltage device includes plural LDMOS devices and the high voltage device includes layout mirroring a basis unit, wherein the basis unit includes: at least one of the SBD; and parts of the plural LDMOS devices, which are arranged by mirrored layout and connected in series in a channel direction; wherein a number of the SBD is not more than a number of the LDMOS devices in the high voltage device, and each SBD is located between the body region and the drain in one of the LDMOS devices, wherein the Schottky semiconductor layer is in contact with the drift region.

In one preferable embodiment, the at least one SBD is located in an isolation region of the high voltage device, and the isolation region is located outside the at least one LDMOS device.

In one preferable embodiment, the SBD further includes two isolation structures, which are located outside two sides of the Schottky metal layer, and are on and in contact with the Schottky semiconductor layer, wherein the two isolation structures are separated by a Schottky channel.

In one preferable embodiment, the SBD further includes two channel side wells, which have the second conductivity type, and are located at different sides out of the Schottky metal layer respectively, wherein the two channel side wells are located in the Schottky semiconductor layer, and are separated by the Schottky channel.

In one preferable embodiment, the SBD further includes two channel side body regions, which have the second conductivity type, and are located at different sides out of the Schottky metal layer respectively, wherein the two channel side wells are located in the Schottky semiconductor layer, and are separated by the Schottky channel, wherein the two channel side body regions and the body region are formed by a same process step.

In one preferable embodiment, the SBD further includes two channel side body contacts, which have the second conductivity type, and are located in the two channel side body regions respectively, wherein the two channel side body contacts are separated by the Schottky channel.

In one preferable embodiment, the SBD further includes two polysilicon layers, which are located on the two channel side body regions respectively, and the polysilicon layer and the corresponding channel side body region are separated by the corresponding isolation structure.

In one preferable embodiment, the LDMOS device further includes a drift oxide region, which is formed on the drift region, wherein the drift oxide region includes a local oxidation of silicon (LOCOS) structure, a shallow trench isolation (STI) structure or a chemical vapor deposition (CVD) oxide structure.

In one preferable embodiment, the gate includes: a dielectric layer, which is formed on the body region and the well, and is in contact with the body region and the well; a conductive layer, which serves as an electrical contact of the gate, and is formed on the dielectric layer and in contact with the dielectric layer; and a spacer layer, which is formed out of two sides of the conductive layer, as an electrical insulative layer of the gate.

The objectives, technical details, features, and effects of the present invention will be better understood with regard to the detailed description of the embodiments below.

BRIEF DESCRIPTION OF THE DRAWINGS

FIGS. 10A-10G show a ninth embodiment of the present invention.

DESCRIPTION OF THE PREFERRED EMBODIMENTS

The drawings as referred to throughout the description of the present invention are for illustration only, to show the interrelations among the process steps and the layers, but the shapes, thicknesses, and widths are not drawn in actual scale.

Figure 1A:
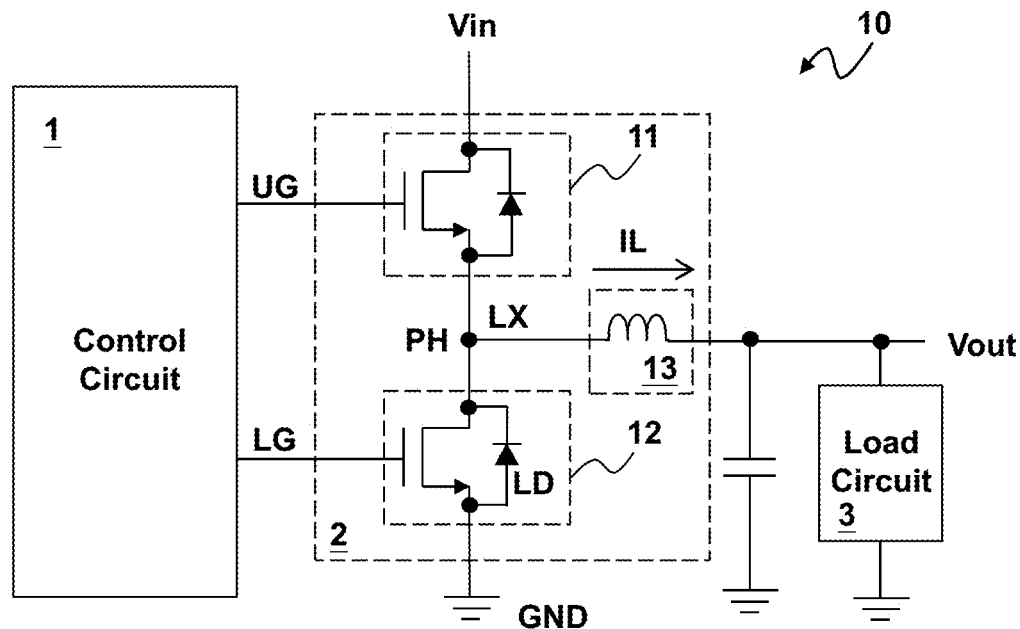
FIG. 1A shows a schematic diagram of a typical switching regulator 10.
Figure 1B:
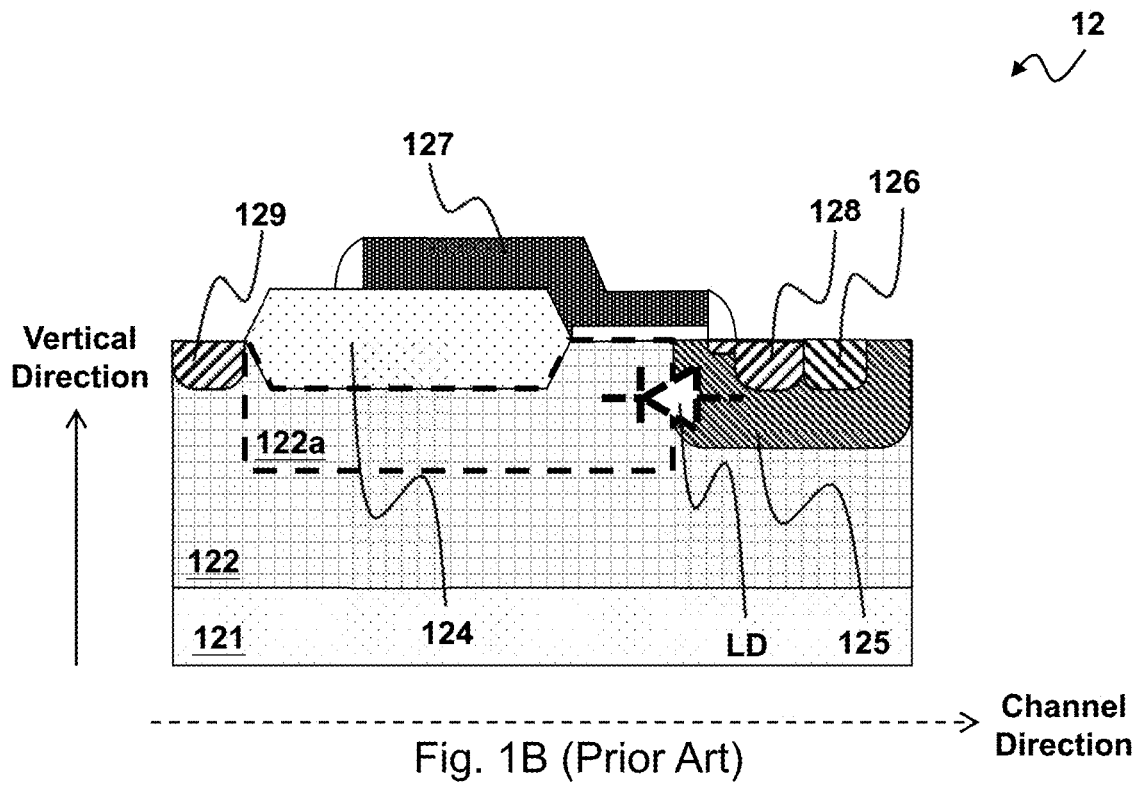
FIG. 1B shows a schematic diagram of a cross-section view of a prior art high voltage device 12 used as a low-side switch.
Figure 2:
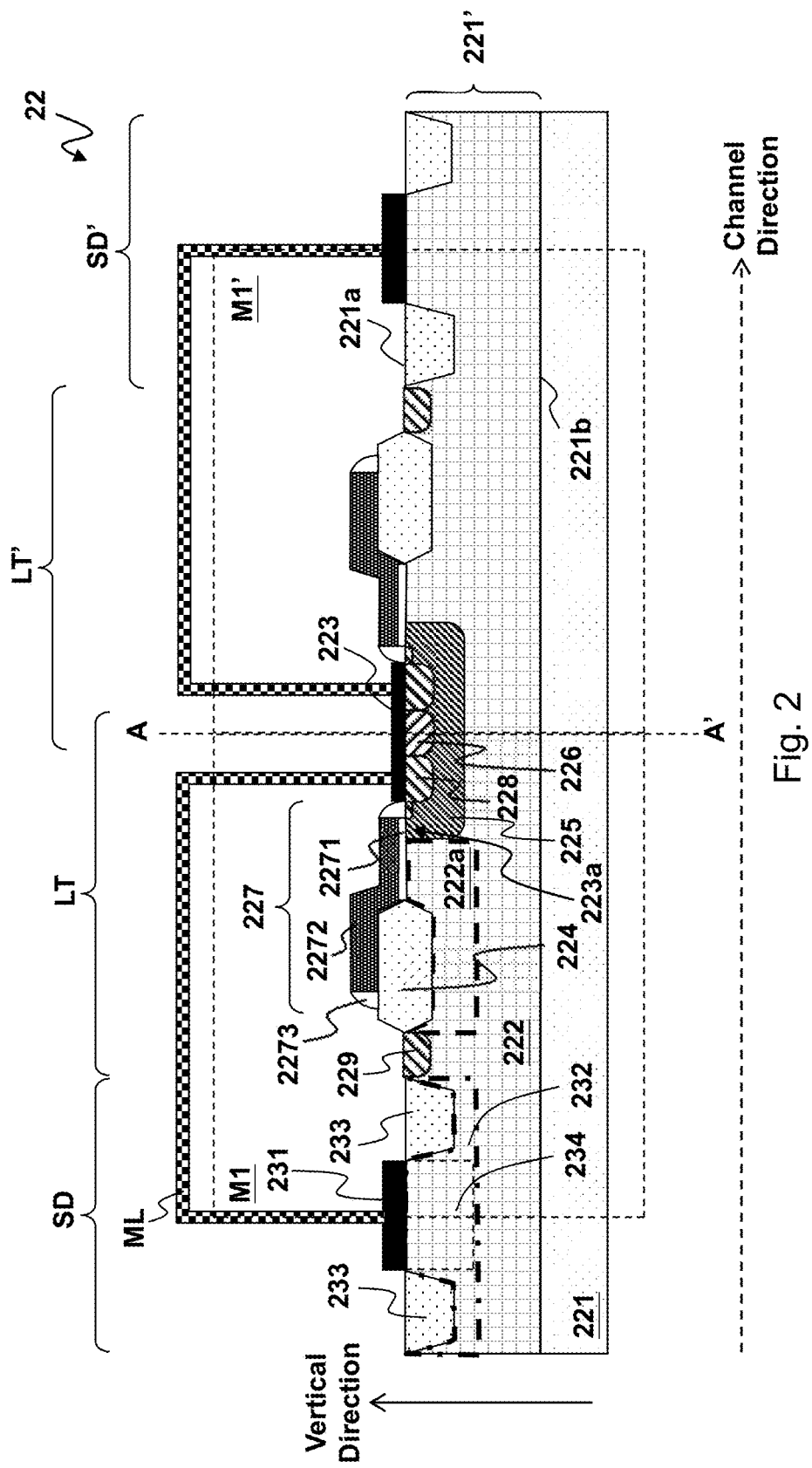
FIG. 2 shows a first embodiment of the present invention.

Please refer to FIG. 2, which shows a first embodiment of the present invention. FIG. 2 is a schematic diagram showing a cross-section view of a high voltage device 22 which is used as a low-side switch in a power stage of a switching regulator. As show in FIG. 2, the high voltage device 22 includes lateral diffused metal oxide semiconductor (LDMOS) devices LT and LT', and Schottky barrier diodes (SBD) SD and SD'. The LDMOS device LT includes a well 222, a drift oxide region 224, a body region 225, a body contact 226, a gate 227, a source 228, and a drain 229.

In the high voltage device 22, the semiconductor layer 221' is formed on the substrate 221. The semiconductor layer 221' has a top surface 221a and a bottom surface 221b opposite to the top surface 221a in a vertical direction (as indicated by the direction of the solid arrow in FIG. 2). The substrate 221 is, for example but not limited to, a P-type or N-type semiconductor substrate. The semiconductor layer 221', for example, is formed on the substrate 221 by an epitaxial process step, or is a part of the substrate 221. The semiconductor layer 221' can be formed by various methods known to a person having ordinary skill in the art, so the details thereof are not redundantly explained here.

Still referring to FIG. 2, the drift oxide region 224 is formed on and in contact with the top surface 221a and is located on and in contact with part of a drift region 222a (as indicated by the dashed line frame shown in FIG. 2). The drift oxide region 224 is for example but not limited to a local oxidation of silicon (LOCOS) structure as shown in the figure, or may be a shallow trench isolation (STI) structure.

The well 222 has the first conductivity type, and is formed in the semiconductor layer 221'. The well 222 is located beneath the top surface 221a and is in contact with the top surface 221a in the vertical direction. The well 222 is formed by for example but not limited to at least one ion implantation process step. The body region 225 has a second conductivity type, and is formed in the well 222. The body region 225 is located beneath and in contact with the top surface 221a in the vertical direction. The body contact 226 has the second conductivity type, and serves as an electrical contact of the body region 225. The body contact 226 is formed in the body region 225, beneath the top surface 221a and in contact with the top surface 221a in the vertical direction. The gate 227 is formed on the top surface 221a of the semiconductor layer 221', wherein part of the body region 225 near the top surface 221a between the source 228 and the well 222 defines an inversion region 223a, as an inversion current channel in the ON operation of the LDMOS device LT, wherein the inversion region 223a is located right below the gate 227 and in contact with the gate 227 to provide the inversion current channel of the LDMOS device LT during the ON operation.

Still referring to FIG. 2, the source 228 and the drain 229 have the first conductivity type. The source 228 and the drain 229 are formed beneath the top surface 221a and in contact with the top surface 221a in the vertical direction. The source 228 and the drain 229 are located at two different sides out of the gate 227 respectively, wherein the source 228 is located in the body region 225, and the drain 229 is located in the well 222 which is away from the body region 225. In the channel direction, part of the well 222 which is near the top surface 221a, and between the body region 225 and the drain 229, defines the drift region 222a. The drift region 222a serves as a drift current channel in the ON operation of the LDMOS device LT.

Note that the term "inversion current channel" 223a means thus. Taking this embodiment as an example, when the LDMOS device LT operates in the ON operation due to the voltage applied to the gate 227, an inversion layer is formed beneath the gate 227, between the source 228 and the drift region 222a, so that a conduction current flows through the region of the inversion layer, which is the inversion current channel known to a person having ordinary skill in the art.

Note that the first conductivity type may be P-type or N-type; when the first conductivity type is P-type, the second conductivity type is N-type, and when the first conductivity type is N-type, the second conductivity type is P-type.

Note that the term "drift current channel" means thus. Taking this embodiment as an example, the drift region refers to a region where the conduction current passes through in a drifting manner when the LDMOS device LT operates in the ON operation, which is known to a person having ordinary skill in the art.

Note that the top surface 221a as referred to does not mean a completely flat plane but refers to the surface of the semiconductor layer 221', as indicated by a thick line in FIG. 2. In the present embodiment, for example, a part of the top surface 221a where the drift oxide region 224 is in contact with has a recessed portion.

Note that the gate 227 as defined in the context of this invention includes a dielectric layer 2271 in contact with the top surface 221a, a conductive layer 2272 which is conductive, and a spacer layer 2273 which is electrically insulative. The dielectric layer 2271 is formed on the body region 225 and the well 222, and is in contact with the body region 225 and the well 222. The conductive layer 2272 serves as an electrical contact of the gate 227, and is formed on the dielectric layer 2271 and in contact with the dielectric layer 2271. The spacer layer 2273 is formed out of two sides of the conductive layer 2272, as an electrically insulative layer of the gate 227.

In addition, the term "high voltage" device means that, when the device operates in normal operation, the voltage applied to the drain is higher than a specific voltage, such as 5V; for devices of different high voltages, a lateral distance (distance of the drift region 222a) between the body region 225 and the drain 229 can be determined according to the operation voltage that the device is designed to withstand during normal operation, which is known to a person having ordinary skill in the art.

Still referring to FIG. 2, the Schottky barrier diode (SBD) SD includes a Schottky metal layer 231 and a Schottky semiconductor layer 232. The Schottky metal layer 231 is formed on the semiconductor layer 221', and is on and in contact with the top surface 221a in the vertical direction. The Schottky metal layer 231 is electrically connected to the source 228 by a metal conductive line ML. The Schottky semiconductor layer 232 is formed in the semiconductor layer 221', wherein the Schottky semiconductor layer 232 and the Schottky metal layer 231 form a Schottky contact. The Schottky semiconductor layer 232 is in contact with the well 222, and is located beneath and in contact with the top surface 221a in the vertical direction. In this embodiment, as shown in the figure, the Schottky semiconductor layer 232 and the well 222 are formed by a same process step, and are in contact with each other in the channel direction and the vertical direction.

The SBD SD for example further includes two isolation structures 233, which are located outside two sides of the Schottky metal layer 231, and are on and in contact with the Schottky semiconductor layer 232, wherein the two isolation structures 233 are separated by a Schottky channel 234. The Schottky channel 234 provides a current path in the SBD SD, where an inversion current flows through when the SBD SD is conductive. The isolation structures 233 is for example but not limited to a shallow trench isolation (STI) structure as shown in the figure, or may be a local oxidation of silicon (LOCOS) structure. In one embodiment, the isolation structures 233 and the drift oxide region 224 may be formed concurrently by a same process step.

Still referring to FIG. 2, the high voltage device 22 includes layout mirroring a basis unit M1 along the axis AA', wherein the basis unit M1 includes: at least part of the SBD SD; and at least part of the LDMOS device LT. In this embodiment, as shown in the figure, the SBD SD is divided into a left part and a right part. The basis unit M1 includes the right part of the SBD SD, and the left part of the SBD SD has a mirrored layout of the right part of the SBD SD. In this embodiment, as shown in the figure, the basis unit M1 includes the right part of the SBD SD, the complete drift oxide region 224, the complete gate 227, the complete source 228, the complete drain 229, a left part of the body region 225, and a left part of the body contact 226 of the LDMOS device LT. Another basis unit M1' has a mirrored layout of the basis unit M1. The high voltage device 22 is formed by mirroring the basis unit M1 to include two or more basis units, and can be extended by mirroring the mirrored layout. The basis unit M1' includes: at least part of the SBD SD' and at least part of the LDMOS device LT'. In this embodiment, the basis unit M1' is a rightward mirrored layout of the basis unit M1 along the axis AA', while in other embodiments, the basis unit M1 can be mirrored leftward to form another basis unit at the left side of the basis unit M1.

Note that, in this embodiment, in the LDMOS devices (including the LDMOS devices LT and LT'), all the wells 222 of are electrically connected to each other, and likely, all the body regions 225, all the body contacts 226, all the gates 227, all the sources 228, and all the drain 229 of the LDMOS devices are respectively electrically connected to each other. In the SBDs (including the SBDs SD and SD'), all the Schottky metal layers 231 are electrically connected to each other, and all the Schottky semiconductor layers 232 are electrically connected to each other. In a preferable embodiment, in the LDMOS device LT, the source 228 and the body contact 226 are electrically connected by a metal silicide layer 223 as shown in the figure.

The present invention is superior to the prior art in that: the operation speed of the high voltage device according to the present invention is higher than the operation speed of the prior art high voltage device; and the SOA of the high voltage device according to the present invention is increased. Taking the embodiment shown in FIG. 2 as an example, according to the present invention, the high voltage device 22 includes the SBDs SD and SD' besides the LDMOS devices LT and LT'. Because the reverse recovery time (trr) of the SBDs SD and SD' are much shorter than the trr of the parasitic diode LD, the operation speed of the high voltage device 22 is greatly increased. Besides, when the high voltage device 22 is used as the low-side switch, in the dead time before turning ON the high voltage device 22, the current induced by the continuity of the inductor current IL can flow through the SBDs SD and SD' instead of the parasitic diode LD, to avoid damage of the high voltage device 22 caused by the reverse current flowing through the parasitic diode LD, whereby the SOA of the high voltage device according to the present invention is increased, and the application range of the present invention is accordingly increased.

Figure 3:
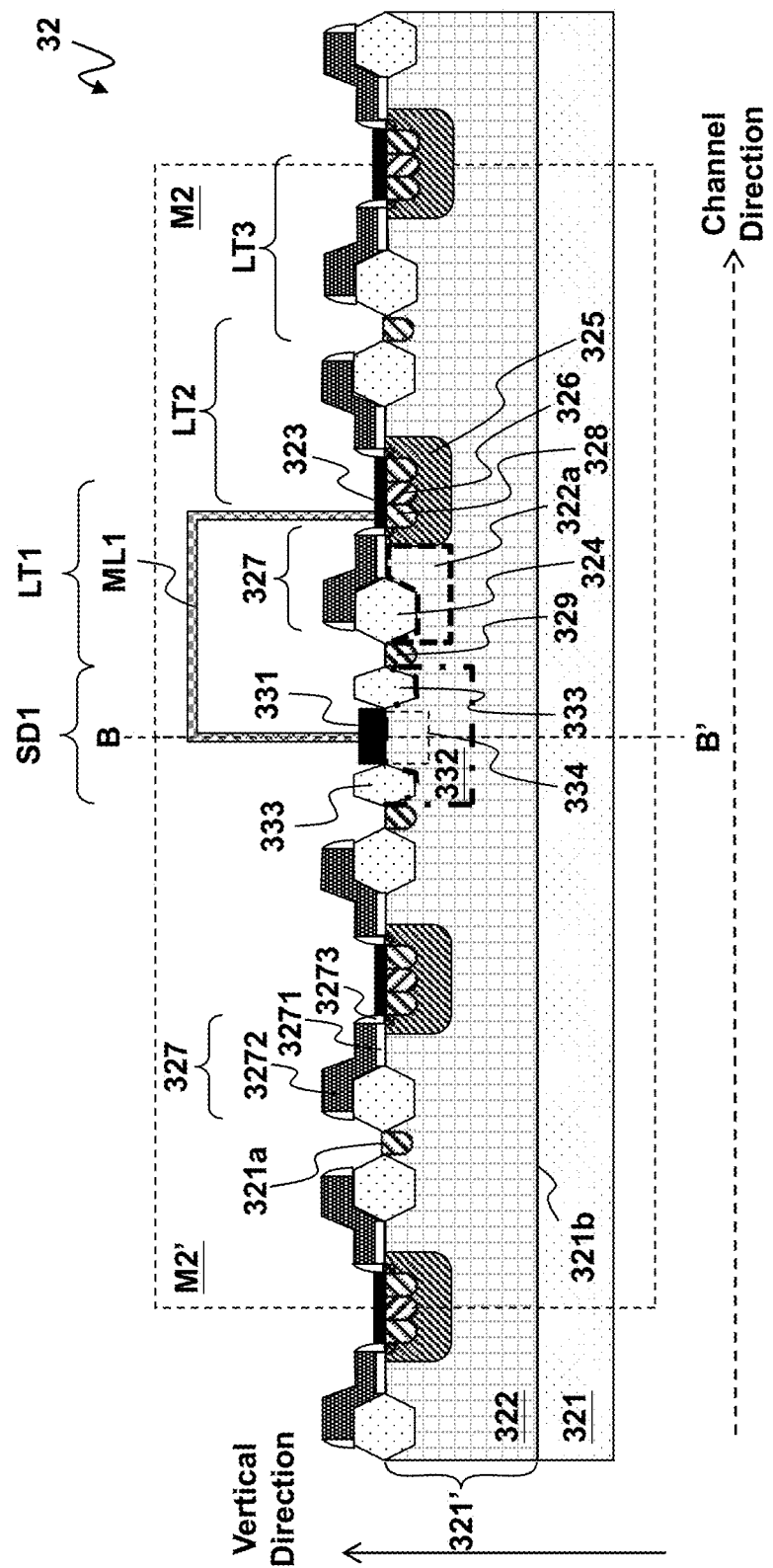
FIG. 3 shows a second embodiment of the present invention.

Please refer to FIG. 3, which shows a second embodiment of the present invention. FIG. 3 is a schematic diagram showing a cross-section view of a high voltage device 32 which is used as a low-side switch in a power stage of a switching regulator. As show in FIG. 3, the high voltage device 32 includes layout mirroring a basis unit M2 along the axis BB', wherein the basis unit M2 includes: at least part of an SBD SD1; and an LDMOS device LT1, an LDMOS device LT2, and part of an LDMOS device LT3.

In this embodiment, as shown in the figure, the SBD SD1 is divided into a left part and a right part in the channel direction, wherein the right part is part of the basis unit M2, and the left part is formed by layout mirroring the right part of the SBD SD1. In this embodiment, as shown in the figure, the LDMOS device LT1 includes a well 322, a drift oxide region 324, a body region 325, a body contact 326, a gate 327, a source 328, and a drain 329. The LDMOS device LT1 has a mirrored layout of the LDMOS device LT2, and vice versa. The LDMOS devices LT1 and LT2 share one common body region 325 and one common body contact 326. The LDMOS device LT2 has a mirrored layout of the LDMOS device LT3, and vice versa, wherein the LDMOS devices LT2 and LT3 share one common drain 329. Another basis unit M2' is formed by layout mirroring the basis unit M2. The high voltage device 32 is formed by layout mirroring the basis unit M2, and can be extended to include more basis units. In this embodiment, the basis unit M2 includes the LDMOS devices LT1 and LT2, part of the LDMOS device LT3, and part of the SBD SD1, wherein the LDMOS devices LT1 and LT2, and part of the LDMOS device LT3 are arranged by mirrored layout and connected in series in the channel direction to form a power device string, and the part of the SBD SD1 is in contact with the power device string in the channel direction.

In the high voltage device 32, the semiconductor layer 321' is formed on the substrate 321. The semiconductor layer 321' has a top surface 321a and a bottom surface 321b opposite to the top surface 321a in a vertical direction (as indicated by the direction of the solid arrow in FIG. 3). The substrate 321 is, for example but not limited to, a P-type or N-type semiconductor substrate. The semiconductor layer 321', for example, is formed on the substrate 321 by an epitaxial process step, or is a part of the substrate 321. The semiconductor layer 321' can be formed by various methods known to a person having ordinary skill in the art, so the details thereof are not redundantly explained here.

Still referring to FIG. 3, the drift oxide region 324 is formed on and in contact with the top surface 321a and is located on and in contact with part of a drift region 322a (as indicated by the dashed line frame shown in FIG. 3). The drift oxide region 324 is for example but not limited to a local oxidation of silicon (LOCOS) structure as shown in the figure, or may be a shallow trench isolation (STI) structure.

The well 322 has the first conductivity type, and is formed in the semiconductor layer 321'. The well 322 is located beneath the top surface 321a and is in contact with the top surface 321a in the vertical direction. The well 322 is formed by for example but not limited to at least one ion implantation process step. The body region 325 has the second conductivity type, and is formed in the well 322. The body region 325 is located beneath and in contact with the top surface 321a in the vertical direction. The body contact 326 has the second conductivity type, and serves as an electrical contact of the body region 325. The body contact 326 is formed in the body region 325, beneath the top surface 321a and in contact with the top surface 321a in the vertical direction. The gate 327 is formed on the top surface 321a of the semiconductor layer 321', wherein part of the body region 325 near the top surface 321a between the source 328 and the well 322 defines an inversion region, as an inversion current channel in the ON operation of the LDMOS device LT1, wherein the inversion region is located right below the gate 327 and in contact with the gate 327 to provide the inversion current channel of the LDMOS device LT1 during the ON operation.

Still referring to FIG. 3, the source 328 and the drain 329 have the first conductivity type. The source 328 and the drain 329 are formed beneath the top surface 321a and in contact with the top surface 321a in the vertical direction. The source 328 and the drain 329 are located at two different sides out of the gate 327 respectively, wherein the source 328 is located in the body region 325, and the drain 329 is located in the well 322 which is away from the body region 325. In the channel direction, part of the well 322 which is near the top surface 321a, and between the body region 325 and the drain 329, defines the drift region 322a. The drift region 322a serves as a drift current channel in the ON operation of the LDMOS device LT1.

Note that the gate 327 as defined in the context of this invention includes a dielectric layer 3271 in contact with the top surface 321a, a conductive layer 3272 which is conductive, and a spacer layer 3273 which is electrically insulative. The dielectric layer 3271 is formed on the body region 325 and the well 322, and is in contact with the body region 325 and the well 322. The conductive layer 3272 serves as an electrical contact of the gate 327, and is formed on the dielectric layer 3271 and in contact with the dielectric layer 3271. The spacer layer 3273 is formed out of two sides of the conductive layer 3272, as an electrical isolation layer of the gate 327.

Still referring to FIG. 3, the Schottky barrier diode (SBD) SD1 includes a Schottky metal layer 331, a Schottky semiconductor layer 332, and two isolation structures 333. The Schottky metal layer 331 is formed on the semiconductor layer 321', and is on and in contact with the top surface 321a in the vertical direction. The Schottky metal layer 331 is electrically connected to the source 328 by a metal conductive line ML1. The Schottky semiconductor layer 332 is formed in the semiconductor layer 321', wherein the Schottky semiconductor layer 332 and the Schottky metal layer 331 form a Schottky contact. The Schottky semiconductor layer 332 is in contact with the well 322, and is located beneath and in contact with the top surface 321a in the vertical direction. In this embodiment, as shown in the figure, the Schottky semiconductor layer 332 and the well 322 are formed by a same process step, and are in contact with each other in the channel direction and the vertical direction.

The two isolation structures 333 are located outside two sides of the Schottky metal layer 331, and are on and in contact with the Schottky semiconductor layer 332, wherein the two isolation structures 333 are separated by a Schottky channel 334. The Schottky channel 334 provides a current path in the SBD SD1, where an inversion current flows through when the SBD SD1 is conductive. The isolation structures 333 is for example but not limited to a local oxidation of silicon (LOCOS) structure as shown in the figure, or may be a shallow trench isolation (STI) structure. The isolation structures 333 and the drift oxide region 324 may be formed concurrently by a same process step.

Note that, in this embodiment, in all the LDMOS devices of the high voltage device 32, such as LDMOS devices LT1, LT2, and LT3, all the wells 322 of the LDMOS devices are electrically connected to each other, and all the body regions 325, all the body contacts 326, all the gates 327, all the sources 328, and all the drain 329 of the LDMOS devices are respectively electrically connected to each other. In a preferable embodiment, in the LDMOS device LT1, the source 328 and the body contact 326 are electrically connected by a metal silicide layer 323 as shown in the figure.

Figure 4A:
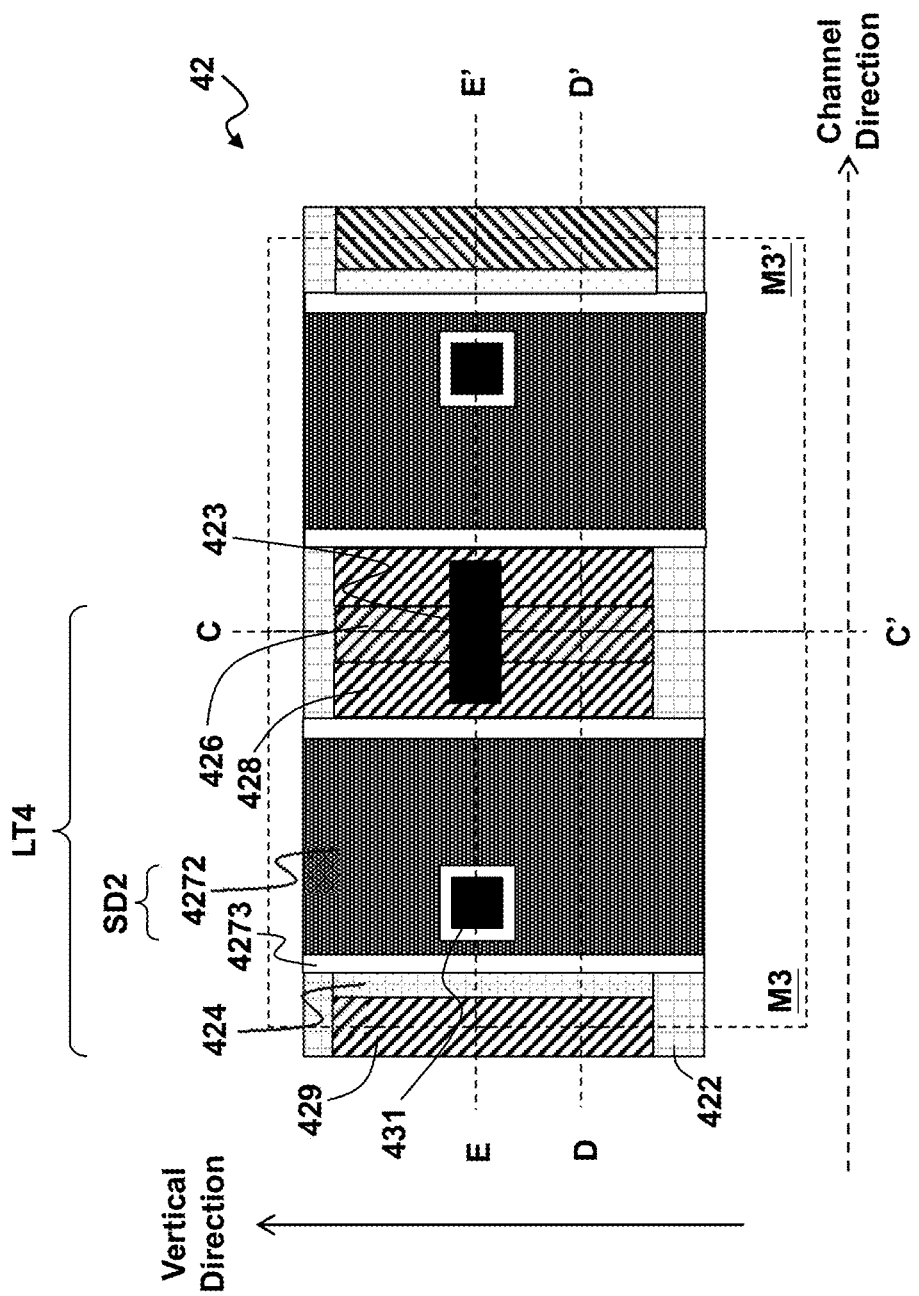
FIGS. 4A-4C show a third embodiment of the present invention.
Figure 4B:
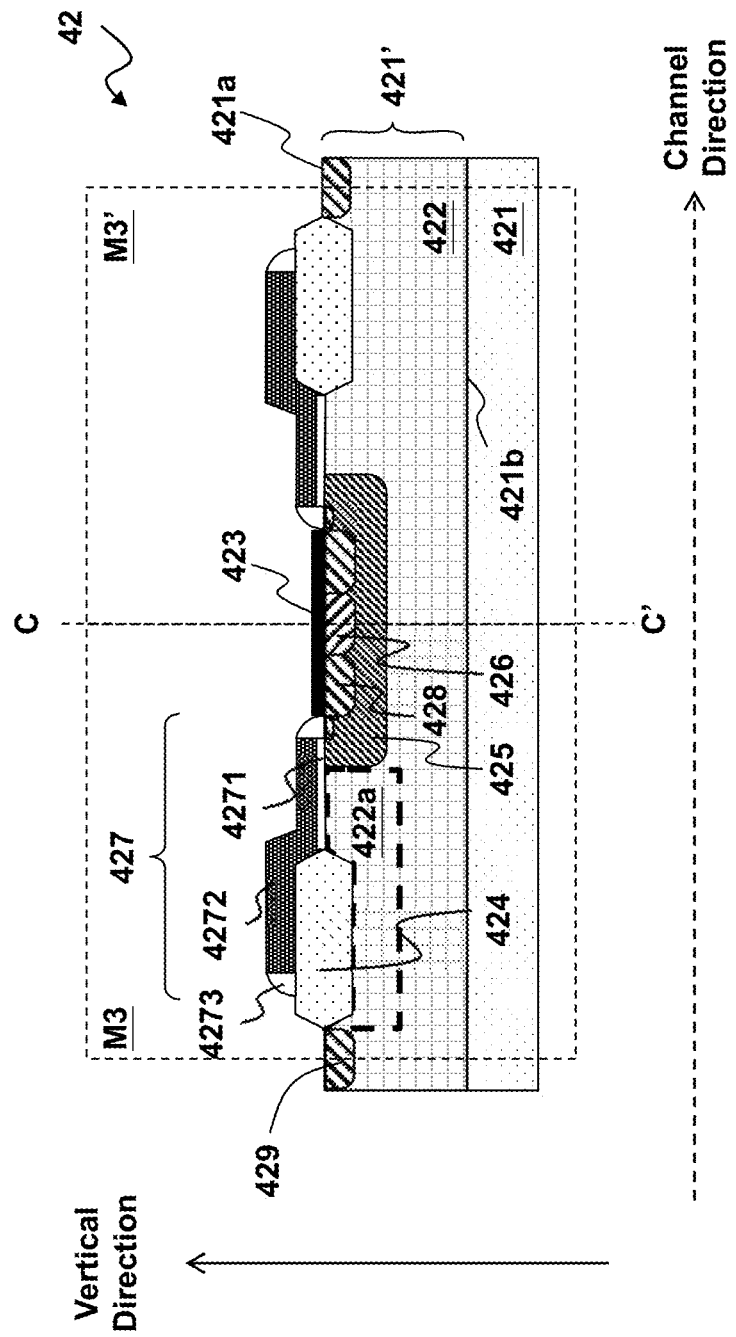
Figure 4C:
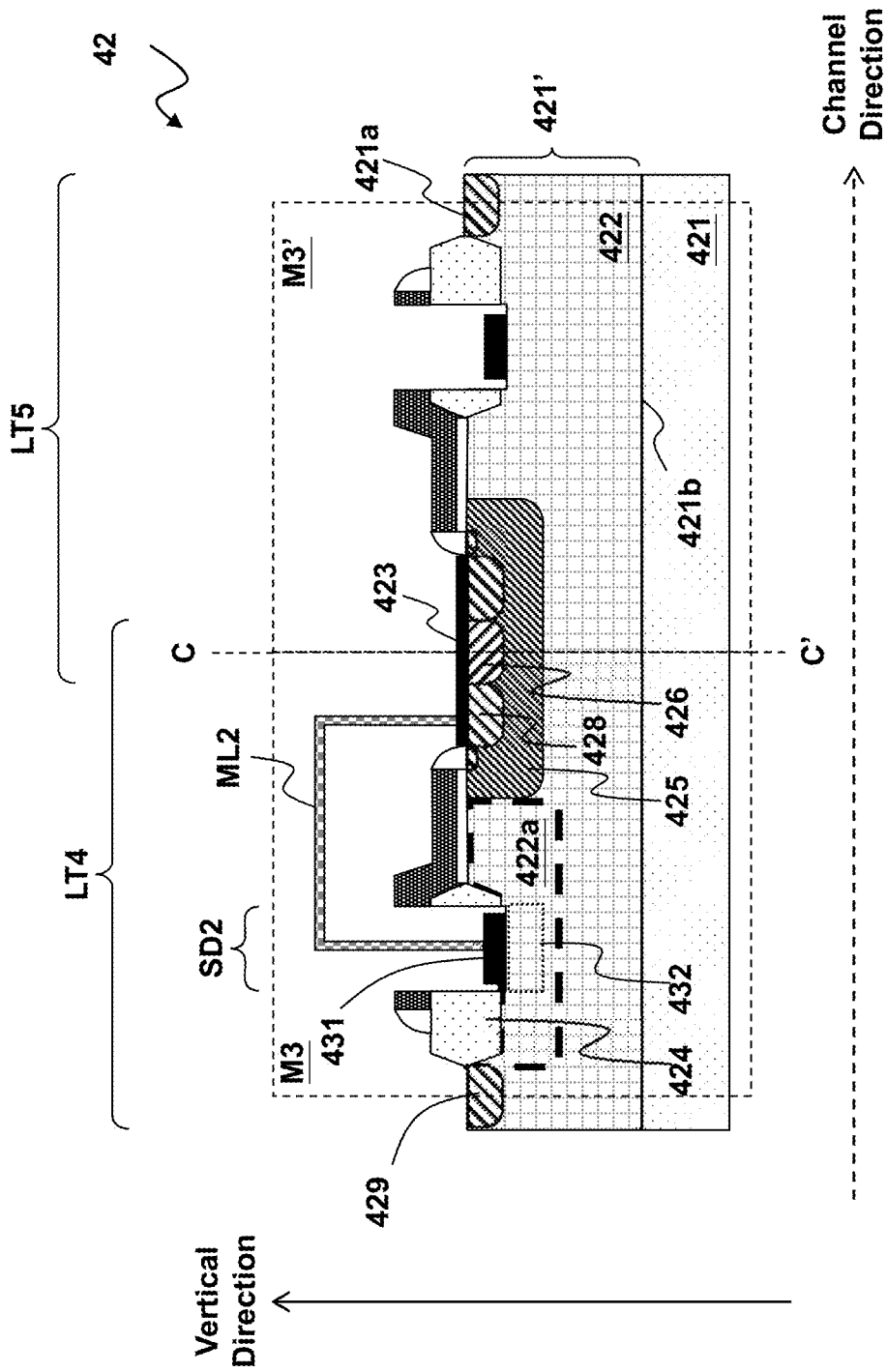

Please refer to FIGS. 4A-4C, which show a third embodiment of the present invention. FIG. 4A is a schematic diagram showing a top view of a high voltage device 42 for use as the low-side switch in the power stage of the switching regulator. FIGS. 4B and 4C are schematic diagrams showing cross-section views of the high voltage device 42 along cross section lines DD' and EE' respectively in FIG. 4A. As shown in FIGS. 4A-4C, the high voltage device 42 includes layout mirroring a basis unit M3 along the axis CC', wherein the basis unit M3 includes: an SBD SD2; and part of an LDMOS device LT4.

In this embodiment, as shown in FIGS. 4A-4C, the LDMOS device LT4 includes a well 422, a drift oxide region 424, a body region 425, a body contact 426, a gate 427, a source 428, and a drain 429. The LDMOS device LT4 has a mirrored layout of the LDMOS device LT5, and vice versa. The LDMOS devices LT4 and LT5 share one common body region 425 and one common body contact 426. Another basis unit M3' is formed by layout mirroring the basis unit M3. The high voltage device 42 includes layout mirroring the basis unit M3, and can be extended to include more basis units. In this embodiment, the basis unit M3 includes the LDMOS devices LT4 and the SBD SD2, wherein the SBD SD2 is located between the body region 425 and the drain 429 of the corresponding LDMOS device LT4, and a Schottky semiconductor layer 432 of the SBD SD2 is in contact with the drift region 422a.

In the high voltage device 42, the semiconductor layer 421' is formed on the substrate 421. The semiconductor layer 421' has a top surface 421a and a bottom surface 421b opposite to the top surface 421a in a vertical direction (as indicated by the direction of the solid arrow in FIG. 4). The substrate 421 is, for example but not limited to, a P-type or N-type semiconductor substrate. The semiconductor layer 421', for example, is formed on the substrate 421 by an epitaxial process step, or is a part of the substrate 421. The semiconductor layer 421' can be formed by various methods known to a person having ordinary skill in the art, so the details thereof are not redundantly explained here.

Still referring to FIGS. 4A-4C, the drift oxide region 424 is formed on and in contact with the top surface 421a and is located on and in contact with part of a drift region 422a (as indicated by the dashed line frame shown in FIGS. 4B and 4C). The drift oxide region 424 is for example but not limited to a local oxidation of silicon (LOCOS) structure as shown in the figures, or may be a shallow trench isolation (STI) structure.

The well 422 has the first conductivity type, and is formed in the semiconductor layer 421'. The well 422 is located beneath the top surface 421a and is in contact with the top surface 421a in the vertical direction. The well 422 is formed by for example but not limited to at least one ion implantation process step. The body region 425 has the second conductivity type, and is formed in the well 422. The body region 425 is located beneath and in contact with the top surface 421a in the vertical direction. The body contact 426 has the second conductivity type, and serves as an electrical contact of the body region 425. The body contact 426 is formed in the body region 425, beneath the top surface 421a and in contact with the top surface 421a in the vertical direction. The gate 427 is formed on the top surface 421a of the semiconductor layer 421', wherein part of the body region 425 near the top surface 421a between the source 428 and the well 422 defines an inversion region, as an inversion current channel in the ON operation of the LDMOS device LT4, wherein the inversion region is located right below the gate 427 and in contact with the gate 427 to provide the inversion current channel of the LDMOS device LT4 during the ON operation.

Still referring to FIGS. 4A-4C, the source 428 and the drain 429 have the first conductivity type. The source 428 and the drain 429 are formed beneath the top surface 421a and in contact with the top surface 421a in the vertical direction. The source 428 and the drain 429 are located at two different sides out of the gate 427 respectively, wherein the source 428 is located in the body region 425, and the drain 429 is located in the well 422 which is away from the body region 425. In the channel direction, part of the well 422 which is near the top surface 421a, and between the body region 425 and the drain 429, defines the drift region 422a. The drift region 422a serves as a drift current channel in the ON operation of the LDMOS device LT4.

Note that the gate 427 as shown in FIG. 4B, includes a dielectric layer 4271 in contact with the top surface 421a, a conductive layer 4272 which is conductive, and a spacer layer 4273 which is electrically insulative. The dielectric layer 4271 is formed on the body region 425 and the well 422, and is in contact with the body region 425 and the well 422. The conductive layer 4272 serves as an electrical contact of the gate 427, and is formed on the dielectric layer 4271 and in contact with the dielectric layer 4271. The spacer layer 4273 is formed out of two sides of the conductive layer 4272, as an electrical isolation layer of the gate 427.

Still referring to FIGS. 4A-4C, the Schottky barrier diode (SBD) SD2 includes a Schottky metal layer 431 and a Schottky semiconductor layer 432. The Schottky metal layer 431 is formed on the semiconductor layer 421', and is on and in contact with the top surface 421a in the vertical direction. The Schottky metal layer 431 is electrically connected to the source 428 by a metal conductive line ML2. The Schottky semiconductor layer 432 is formed in the semiconductor layer 421', wherein the Schottky semiconductor layer 432 and the Schottky metal layer 431 form a Schottky contact. The Schottky semiconductor layer 432 is in contact with the drift region 422a in the well 422, and is located beneath and in contact with the top surface 421a in the vertical direction. In this embodiment, the Schottky semiconductor layer 432 and the well 422 are formed by a same process step, and are in contact with each other in the channel direction and the vertical direction.

This embodiment is different from the first embodiment in that, in this embodiment, as shown in FIGS. 4A and 4C, the SBD SD2 is located right above the drift region 422a. The SBD SD2 is formed by opening a hole through the gate 428 to the drift region 422a, and the SBD SD2 is formed inside the hole; therefore in one aspect, the LDMOS device LT4 corresponds to the SBD SD2.

Note that, in this embodiment, in the high voltage device 42, all the wells 422 of the LDMOS devices including the LDMOS devices LT4 and LT5 are electrically connected to each other, and all the body regions 425, all the body contacts 426, all the gates 427, all the sources 428, and all the drain 429 of the LDMOS devices are respectively electrically connected to each other. In a preferable embodiment, in the LDMOS device LT4, the source 428 and the body contact 426 are electrically connected by a metal silicide layer 423 as shown in the figure.

Figure 5A:
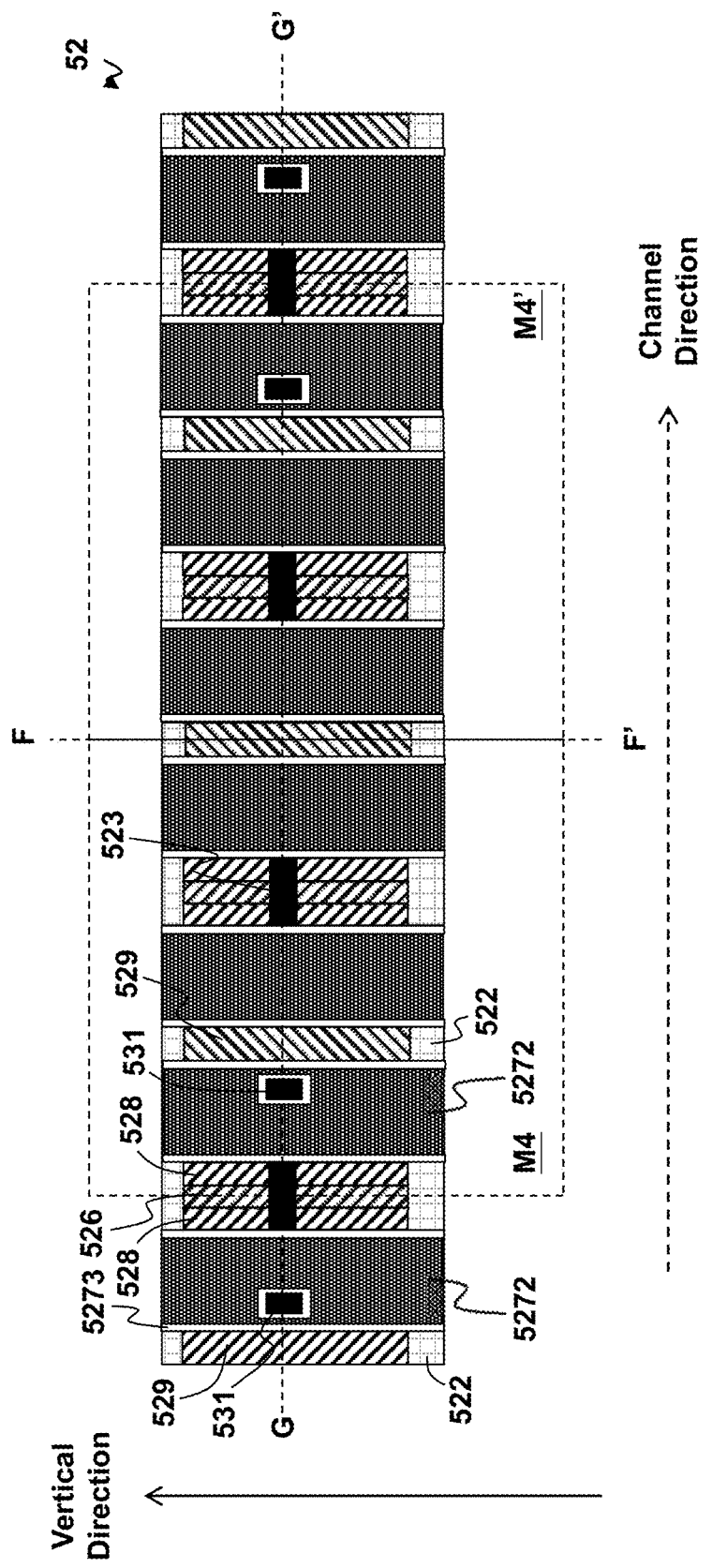
FIGS. 5A-5B show a fourth embodiment of the present invention.
Figure 5B:
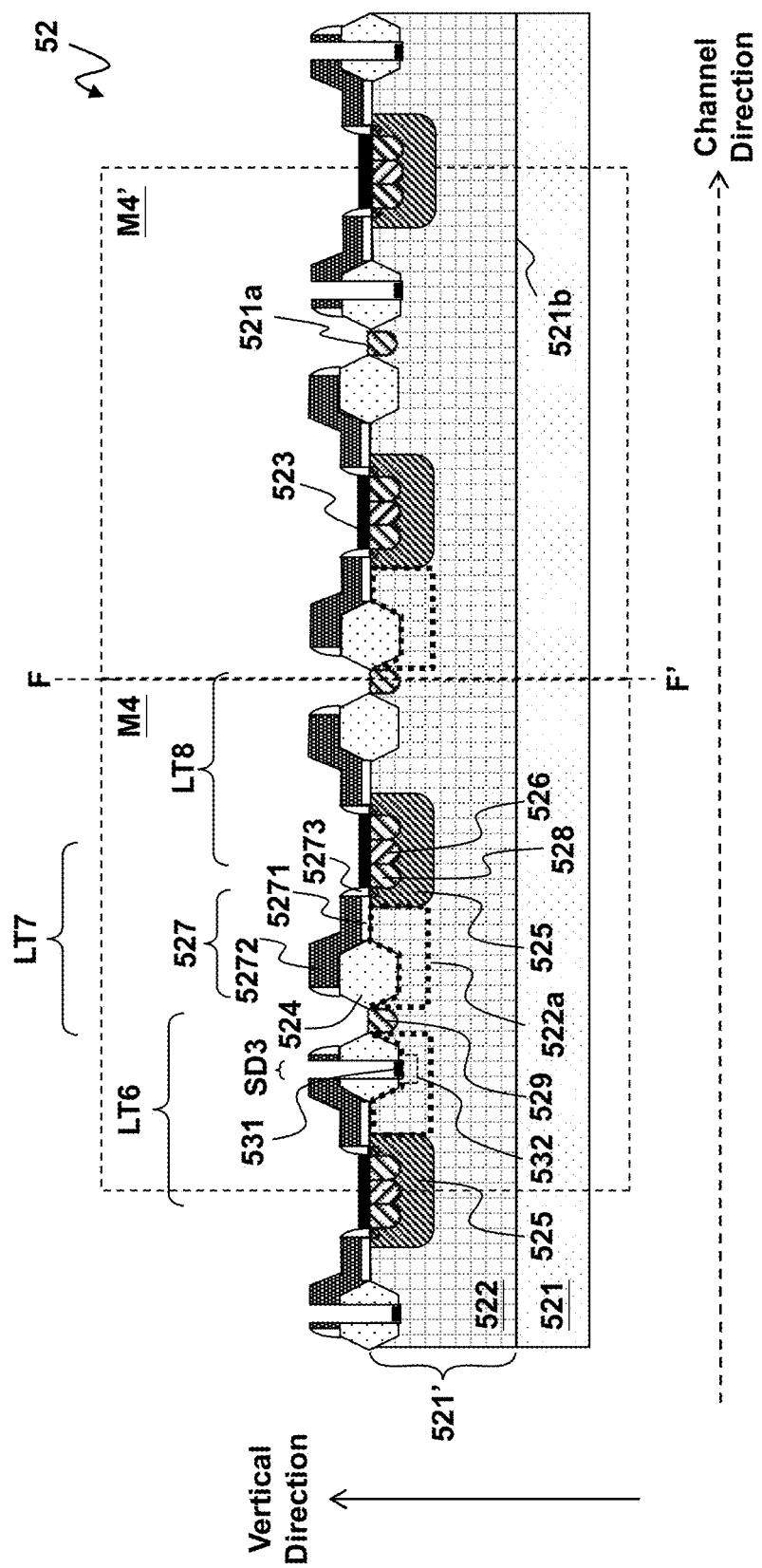

Please refer to FIGS. 5A-5B, which show a fourth embodiment of the present invention. FIG. 5A is a schematic diagram showing a top view of a high voltage device 52 for use as the low-side switch in the power stage of the switching regulator. FIG. 5B shows a schematic diagram of a cross-section view of the high voltage device 52 along a cross section line GG' in FIG. 4A. As shown in FIGS. 5A-5B, the high voltage device 52 includes layout mirroring a basis unit M4 along the axis FF', wherein the basis unit M4 includes: an SBD SD3, part of an LDMOS device LT6, an LDMOS device LT7, and part of an LDMOS device LT8.

In this embodiment, as shown in FIGS. 5A-5B, the LDMOS device LT7 includes a well 522, a drift oxide region 524, a body region 525, a body contact 526, a gate 527, a source 528, and a drain 529. The LDMOS device LT7 has a mirrored layout of the LDMOS device LT8, and vice versa. The LDMOS devices LT7 and LT8 share one common body region 525 and one common body contact 526. The LDMOS device LT6 is in contact with the LDMOS device LT7 in the channel direction, and the LDMOS devices LT6 and LT7 share one common drain 529. The SBD SD3 is located between the body region 525 and the drain 529 of the corresponding LDMOS device LT6. In this embodiment, the basis unit M4 includes the LDMOS devices LT7, part of the LDMOS device LT6, part of the LDMOS device LT8, and the SBD SD3. The LDMOS device LT6 (excluding the SD3), the LDMOS device LT7, and the LDMOS device LT8 are arranged by mirrored layout and connected in series in the channel direction to form a power device string, and the SBD SD3 is located between the body region 525 and the drain 529 inside the corresponding LDMOS device LT6, i.e., inside the power device string. Another basis unit M4' is formed by layout mirroring the basis unit M4. The high voltage device 52 includes layout mirroring the basis unit M4, and can be extended to include more basis units. In this embodiment, the SBD SD3 is located between the body region 525 and the drain 529 of the corresponding LDMOS device LT6, and a Schottky semiconductor layer 532 of the SBD SD3 is in contact with the drift region 522a.

In the high voltage device 52, the semiconductor layer 521' is formed on the substrate 521. The semiconductor layer 521' has a top surface 521a and a bottom surface 521b opposite to the top surface 521a in a vertical direction (as indicated by the direction of the solid arrow in FIG. 5). The substrate 521 is, for example but not limited to, a P-type or N-type semiconductor substrate. The semiconductor layer 521', for example, is formed on the substrate 521 by an epitaxial process step, or is a part of the substrate 521. The semiconductor layer 521' can be formed by various methods known to a person having ordinary skill in the art, so the details thereof are not redundantly explained here.

Still referring to FIGS. 5A-5B, the drift oxide region 524 is formed on and in contact with the top surface 521a and is located on and in contact with part of a drift region 522a (as indicated by the thick dashed line frame shown in FIG. 5B). The drift oxide region 524 is for example but not limited to a local oxidation of silicon (LOCOS) structure as shown in the figure, or may be a shallow trench isolation (STI) structure.

The well 522 has the first conductivity type, and is formed in the semiconductor layer 521'. The well 522 is located beneath the top surface 521a and is in contact with the top surface 521a in the vertical direction. The well 522 is formed by for example but not limited to at least one ion implantation process step. The body region 525 has the second conductivity type, and is formed in the well 522. The body region 525 is located beneath and in contact with the top surface 521a in the vertical direction. The body contact 526 has the second conductivity type, and serves as an electrical contact of the body region 525. The body contact 526 is formed in the body region 525, beneath the top surface 521a and in contact with the top surface 521a in the vertical direction. The gate 527 is formed on the top surface 521a of the semiconductor layer 521', wherein part of the body region 525 near the top surface 521a between the source 528 and the well 522 defines an inversion region, as an inversion current channel in the ON operation of the LDMOS device LT7, wherein the inversion region is located right below the gate 527 and in contact with the gate 527 to provide the inversion current channel of the LDMOS device LT7 during the ON operation.

Still referring to FIGS. 5A-5B, the source 528 and the drain 529 have the first conductivity type. The source 528 and the drain 529 are formed beneath the top surface 521a and in contact with the top surface 521a in the vertical direction. The source 528 and the drain 529 are located at two different sides out of the gate 527 respectively, wherein the source 528 is located in the body region 525, and the drain 529 is located in the well 522 which is away from the body region 525. In the channel direction, part of the well 522 which is near the top surface 521a, and between the body region 525 and the drain 529, defines the drift region 522a. The drift region 522a serves as a drift current channel in the ON operation of the LDMOS device LT7.

Note that the gate 527 as shown in FIG. 5B, includes a dielectric layer 5271 in contact with the top surface 521a, a conductive layer 5272 which is conductive, and a spacer layer 5273 which is electrically insulative. The dielectric layer 5271 is formed on the body region 525 and the well 522, and is in contact with the body region 525 and the well 522. The conductive layer 5272 serves as an electrical contact of the gate 527, and is formed on the dielectric layer 5271 and in contact with the dielectric layer 5271. The spacer layer 5273 is formed out of two sides of the conductive layer 5272, as an electrical isolation layer of the gate 527.

Still referring to FIGS. 5A-5B, the Schottky barrier diode (SBD) SD3 includes a Schottky metal layer 531 and a Schottky semiconductor layer 532. The Schottky metal layer 531 is formed on the semiconductor layer 521', and is on and in contact with the top surface 521a in the vertical direction. The Schottky metal layer 531 is electrically connected to the source 528 by a metal conductive line. The Schottky semiconductor layer 532 is formed in the semiconductor layer 521', wherein the Schottky semiconductor layer 532 and the Schottky metal layer 531 form a Schottky contact. The Schottky semiconductor layer 532 is in contact with the drift region 522a in the well 522, and is located beneath and in contact with the top surface 521a in the vertical direction. In this embodiment, the Schottky semiconductor layer 532 and the well 522 are formed by a same process step, and are in contact with each other in the channel direction and the vertical direction.

This embodiment is different from the third embodiment in that, in this embodiment, as shown in FIGS. 5A and 5B, the SBD SD3 is located inside the LDMOS device LT6, and the LDMOS device LT6 is connected to the plural LDMOS devices to form the basis unit M4.

Note that, in this embodiment, in the high voltage device 52, all the wells 522 of the LDMOS devices including the LDMOS devices LT6, LT7, and LT8, are electrically connected to each other, and all the body regions 525, all the body contacts 526, all the gates 527, all the sources 528, and all the drain 529 of the LDMOS devices are respectively electrically connected to each other. In a preferable embodiment, in the LDMOS device LT7, the source 528 and the body contact 526 are electrically connected by a metal silicide layer 523 as shown in the figure.

Figure 6A:
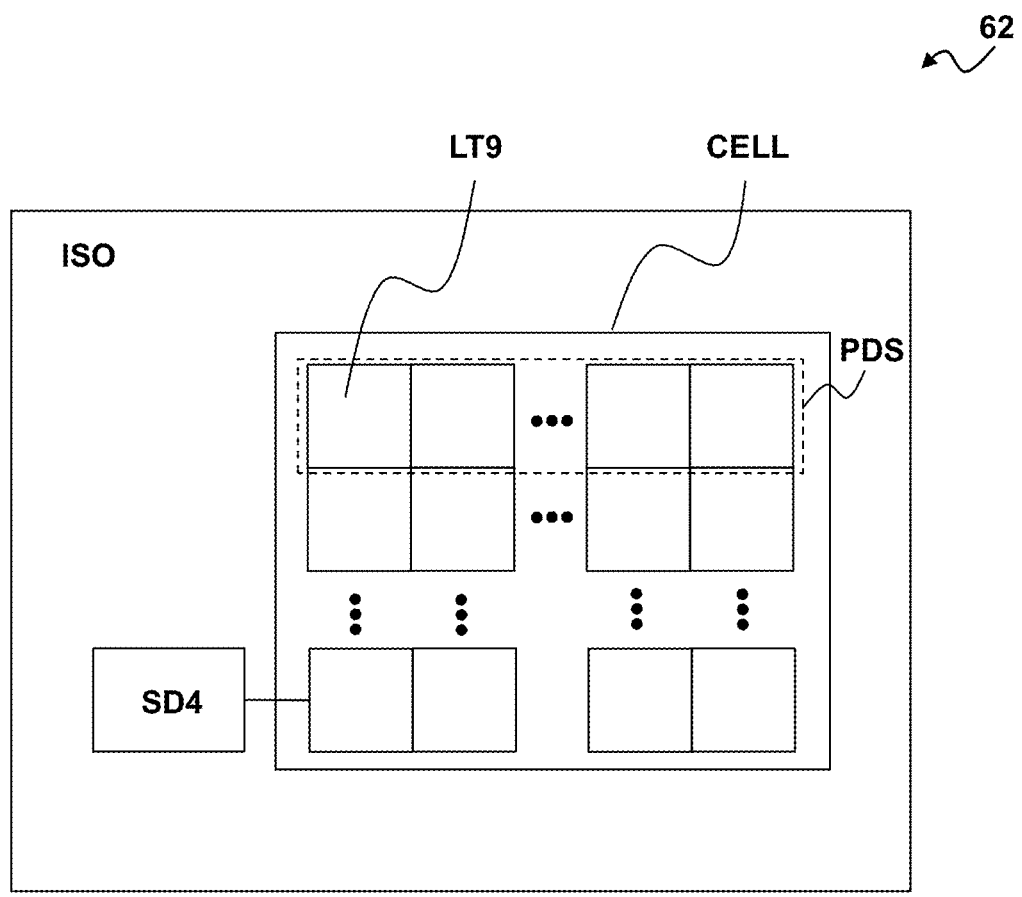
FIGS. 6A-6B show a fifth embodiment of the present invention.
Figure 6B:
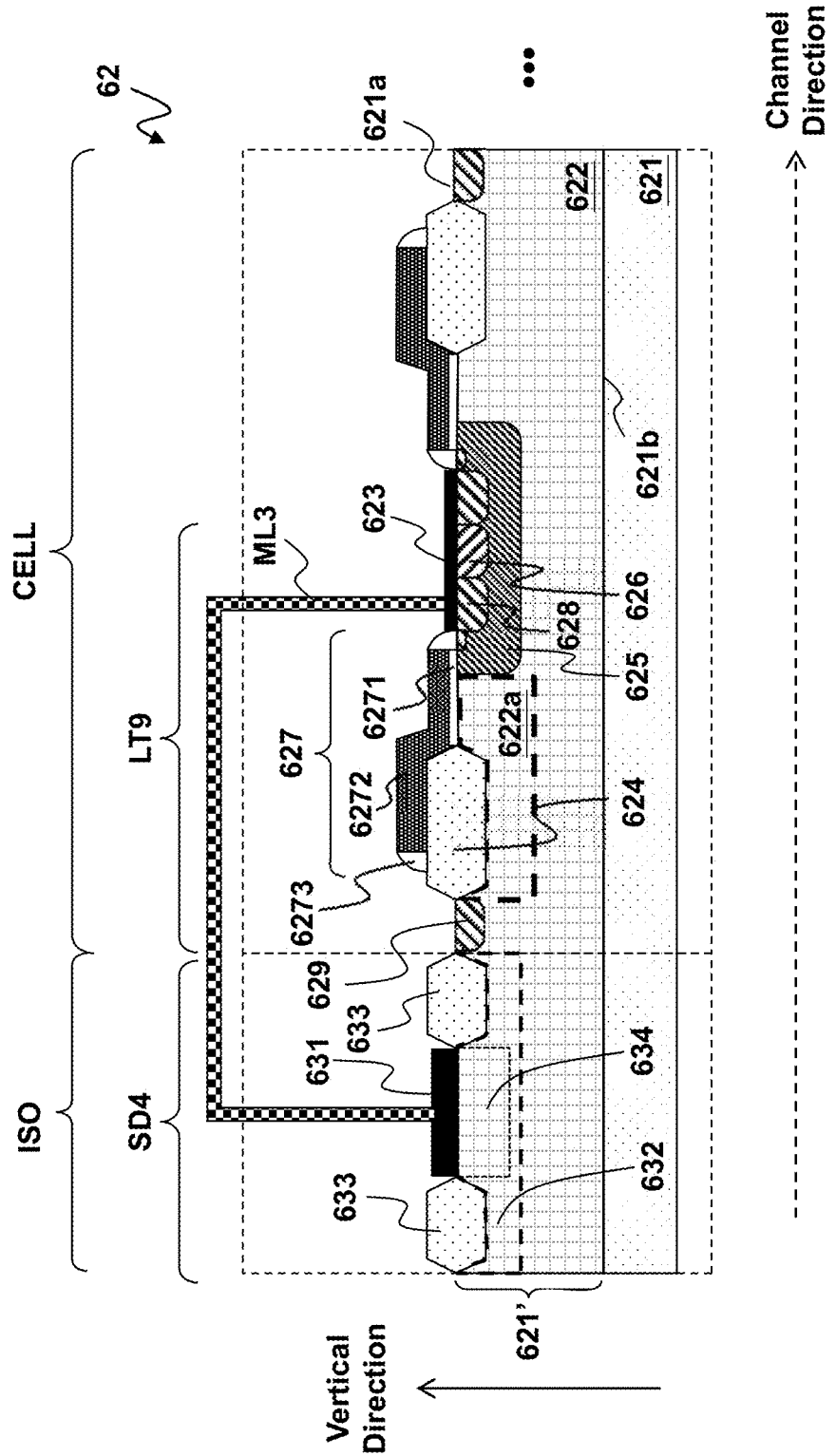

Please refer to FIGS. 6A-6B, which show a fifth embodiment of the present invention. FIG. 6A is a schematic diagram showing a top view of a high voltage device 62 for use as the low-side switch in the power stage of the switching regulator. FIG. 6B is a schematic diagram showing a cross-section view of an SBD SD4 and an LDMOS device LT9 which is connected to the SBD SD4 shown in FIG. 6A.

As shown in FIG. 6A, the high voltage device 62 includes an LDMOS device region CELL and an isolation region ISO. The LDMOS device region CELL includes plural power device strings PDS. Each power device string PDS includes plural LDMOS devices LT9 which are arranged by mirrored layout and connected in series in the channel direction to form the power device string PDS. The isolation region ISO is located outside the device region CELL, wherein the isolation region ISO includes at least one SBD SD4. The SBD SD4 is in contact with the LDMOS device LT9. The isolation region ISO is configured to isolate the high voltage device 62 from other devices in the same substrate.

As shown in FIG. 6B, the high voltage device 62 includes LDMOS devices LT and LT', and SBDs SD and SD'. The LDMOS device LT9 includes a well 622, a drift oxide region 624, a body region 625, a body contact 626, a gate 627, a source 628, and a drain 629.

In the high voltage device 62, the semiconductor layer 621' is formed on the substrate 621. The semiconductor layer 621' has a top surface 621a and a bottom surface 621b opposite to the top surface 621a in a vertical direction (as indicated by the direction of the solid arrow in FIG. 6B). The substrate 621 is, for example but not limited to, a P-type or N-type semiconductor substrate. The semiconductor layer 621', for example, is formed on the substrate 621 by an epitaxial process step, or is a part of the substrate 621. The semiconductor layer 621' can be formed by various methods known to a person having ordinary skill in the art, so the details thereof are not redundantly explained here.

Still referring to FIG. 6B, the drift oxide region 624 is formed on and in contact with the top surface 621a and is located on and in contact with part of a drift region 622a (as indicated by the dashed line frame in the LDMOS device LT9 shown in FIG. 6B). The drift oxide region 624 is for example but not limited to a local oxidation of silicon (LOCOS) structure as shown in the figure, or may be a shallow trench isolation (STI) structure.

The well 622 has the first conductivity type, and is formed in the semiconductor layer 621'. The well 622 is located beneath the top surface 621a and is in contact with the top surface 621a in the vertical direction. The well 622 is formed by for example but not limited to at least one ion implantation process step. The body region 625 has the second conductivity type, and is formed in the well 622. The body region 625 is located beneath and in contact with the top surface 621a in the vertical direction. The body contact 626 has the second conductivity type, and serves as an electrical contact of the body region 625. The body contact 626 is formed in the body region 625, beneath the top surface 621a and in contact with the top surface 621a in the vertical direction. The gate 627 is formed on the top surface 621a of the semiconductor layer 621', wherein part of the body region 625 near the top surface 621a between the source 628 and the well 622 defines an inversion region, as an inversion current channel in the ON operation of the LDMOS device LT9, wherein the inversion region is located right below the gate 627 and in contact with the gate 627 to provide the inversion current channel of the LDMOS device LT9 during the ON operation.

Still referring to FIG. 6B, the source 628 and the drain 629 have the first conductivity type. The source 628 and the drain 629 are formed beneath the top surface 621a and in contact with the top surface 621a in the vertical direction. The source 628 and the drain 629 are located at two different sides out of the gate 627 respectively, wherein the source 628 is located in the body region 625, and the drain 629 is located in the well 622 which is away from the body region 625. In the channel direction, part of the well 622 which is near the top surface 621a, and between the body region 625 and the drain 629, defines the drift region 622a. The drift region 622a serves as a drift current channel in the ON operation of the LDMOS device LT9.

In one preferable embodiment, the gate 627 includes a dielectric layer 6271 in contact with the top surface 621a, a conductive layer 6272 which is conductive, and a spacer layer 6273 which is electrically insulative. The dielectric layer 6271 is formed on the body region 625 and the well 622, and is in contact with the body region 625 and the well 622. The conductive layer 6272 serves as an electrical contact of the gate 627, and is formed on the dielectric layer 6271 and in contact with the dielectric layer 6271. The spacer layer 6273 is formed out of two sides of the conductive layer 6272, as an electrical isolation layer of the gate 627.

Still referring to FIG. 6B, the Schottky barrier diode (SBD) SD4 includes a Schottky metal layer 631 and a Schottky semiconductor layer 632. The Schottky metal layer 631 is formed on the semiconductor layer 621', and is on and in contact with the top surface 621a in the vertical direction. The Schottky metal layer 631 is electrically connected to the source 628 by a metal conductive line ML3. The Schottky semiconductor layer 632 is formed in the semiconductor layer 621', wherein the Schottky semiconductor layer 632 and the Schottky metal layer 631 form a Schottky contact. The Schottky semiconductor layer 632 is in contact with the well 622, and is located beneath and in contact with the top surface 621a in the vertical direction. In this embodiment, as shown in the figure, the Schottky semiconductor layer 632 and the well 622 are formed by a same process step, and are in contact with each other in the channel direction and the vertical direction.

The SBD SD4 for example further includes two isolation structures 633, which are located outside two sides of the Schottky metal layer 631, and are on and in contact with the Schottky semiconductor layer 632, wherein the two isolation structures 633 are separated by a Schottky channel 634. The Schottky channel 634 provides a current path in the SBD SD4, where an inversion current flows through when the SBD SD4 is conductive. The isolation structures 633 is for example but not limited to a local oxidation of silicon (LOCOS) structure as shown in the figure, or may be a shallow trench isolation (STI) structure. The isolation structures 633 and the drift oxide region 624 may be formed concurrently by a same process step.

Note that, in this embodiment, in the high voltage device 62, all the wells 622 of the LDMOS devices including the LDMOS device LT9, are electrically connected to each other, and all the body regions 625, all the body contacts 626, all the gates 627, all the sources 628, and all the drain 629 of the LDMOS devices are respectively electrically connected to each other. In a preferable embodiment, in the LDMOS device LT9, the source 628 and the body contact 626 are electrically connected by a metal silicide layer 623 as shown in the figure.

Figure 7:
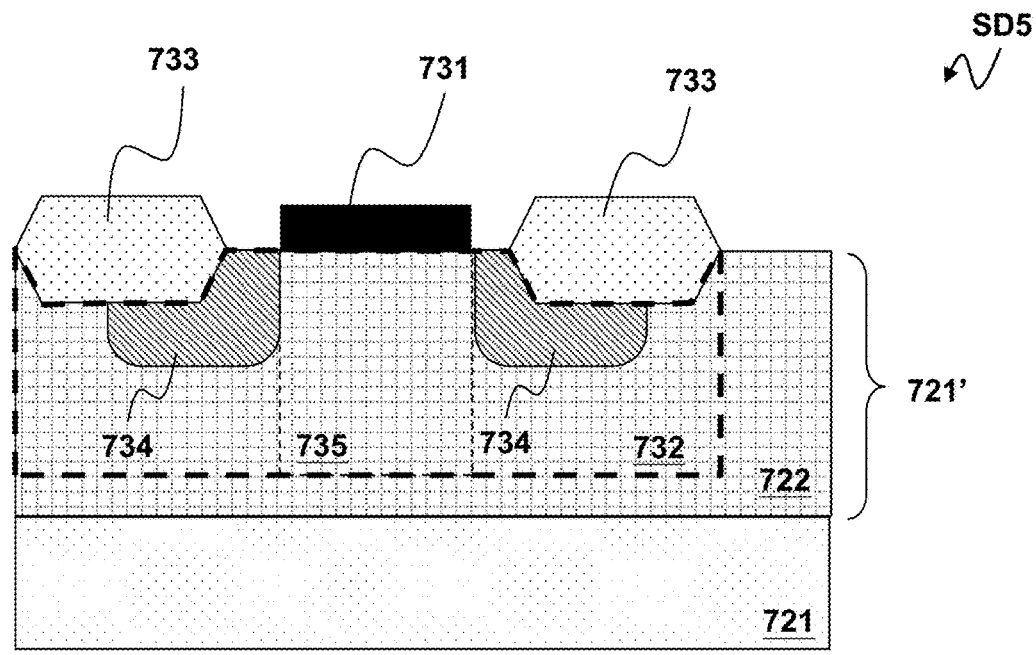
FIG. 7 shows a sixth embodiment of the present invention.

Please refer to FIG. 7, which shows a sixth embodiment of the present invention. FIG. 7 is a schematic diagram showing a cross-section view of a Schottky barrier diode (SBD) SD5. As shown in the figure, the SBD SD5 includes a Schottky metal layer 731, a Schottky semiconductor layer 732, two isolation structures 733, and two channel side wells 734. The Schottky metal layer 731 is formed on the semiconductor layer 721'. The Schottky semiconductor layer 732 is formed in the semiconductor layer 721', wherein the Schottky semiconductor layer 732 and the Schottky metal layer 731 form a Schottky contact. The Schottky semiconductor layer 732 is in contact with a well 722 of an LDMOS device, wherein the well 722 has the first conductivity type. In this embodiment, as shown in the figure, the Schottky semiconductor layer 732 and the well 722 are formed by a same process step, and are in contact with each other in the channel direction and the vertical direction.

The two isolation structures 733 are located outside two sides of the Schottky metal layer 731, and are on and in contact with the Schottky semiconductor layer 732, wherein the two isolation structures 733 are separated by a Schottky channel 735. The Schottky channel 735 provides a current path in the SBD SD5, where an inversion current flows through when the SBD SD5 is conductive. The isolation structures 733 is for example but not limited to a local oxidation of silicon (LOCOS) structure as shown in the figure, or may be a shallow trench isolation (STI) structure. The isolation structures 733 and a drift oxide region of the LDMOS device may be formed concurrently by a same process step. The two channel side wells 734 have the second conductivity type, and are located at different sides out of the Schottky metal layer 731 respectively, wherein the two channel side wells 734 are located in the Schottky semiconductor layer 732, and are separated by the Schottky channel 735. The two channel side wells 734 for example may be formed together with a well having the second conductivity type of another device by a same process step.

Figure 8:
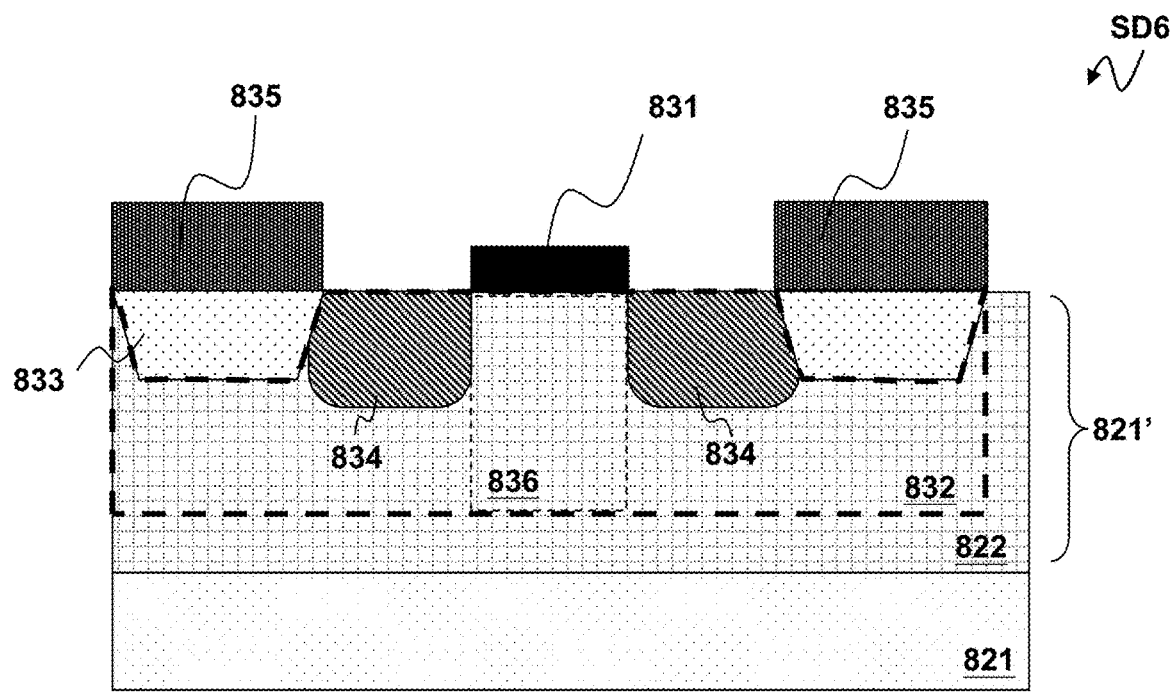
FIG. 8 shows a seventh embodiment of the present invention.

Please refer to FIG. 8, which shows a seventh embodiment of the present invention. FIG. 8 is a schematic diagram showing a cross-section view of a Schottky barrier diode (SBD) SD6. As shown in the figure, the SBD SD6 includes a Schottky metal layer 831, a Schottky semiconductor layer 832, two isolation structures 833, two polysilicon layers 835, and two channel side body regions 834. The Schottky metal layer 831 is formed on the semiconductor layer 821'. The Schottky semiconductor layer 832 is formed in the semiconductor layer 821', wherein the Schottky semiconductor layer 832 and the Schottky metal layer 831 form a Schottky contact. The Schottky semiconductor layer 832 is in contact with a well 822 of an LDMOS device, wherein the well 822 has the first conductivity type. In this embodiment, as shown in the figure, the Schottky semiconductor layer 832 and the well 822 are formed by a same process step, and are in contact with each other in the channel direction and the vertical direction.

The two isolation structures 833 are located outside two sides of the Schottky metal layer 831, and are on and in contact with the Schottky semiconductor layer 832, wherein the two isolation structures 833 are separated by a Schottky channel 836. The Schottky channel 836 provides a current path in the SBD SD6, where an inversion current flows through when the SBD SD6 is conductive. The isolation structures 833 is for example but not limited to a shallow trench isolation (STI) structure as shown in the figure, or may be a local oxidation of silicon (LOCOS) structure. The isolation structures 833 and a drift oxide region of the LDMOS device may be formed concurrently by a same process step.

The two channel side body regions 834 have the second conductivity type, and are located at different sides out of the Schottky metal layer 831 respectively, wherein the two channel side body regions 834 are located in the Schottky semiconductor layer 832, and are separated by the Schottky channel 836. The two channel side wells 834 for example may be formed together with a body region having the second conductivity type of another device by a same process step.

Figure 9:
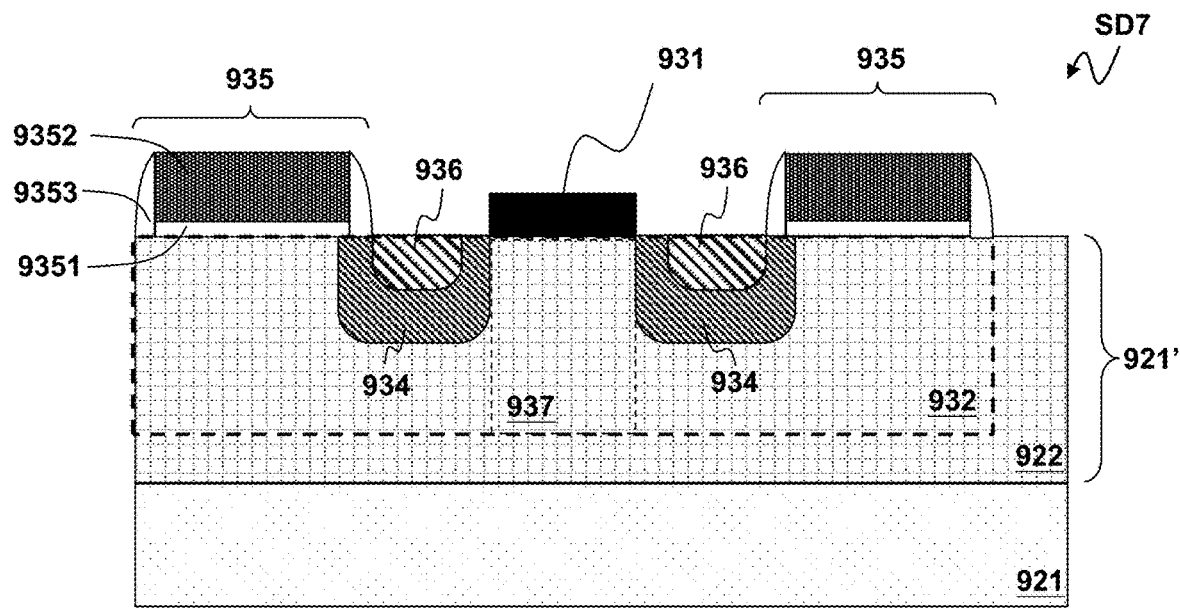
FIG. 9 shows an eighth embodiment of the present invention.

Please refer to FIG. 9, which shows an eighth embodiment of the present invention. FIG. 9 is a schematic diagram showing a cross-section view of a Schottky barrier diode (SBD) SD7. As shown in the figure, the SBD SD7 includes a Schottky metal layer 931, a Schottky semiconductor layer 932, two channel side body regions 934, two gates 935, and two channel side body contacts 936. The Schottky metal layer 931 is formed on the semiconductor layer 921'. The Schottky semiconductor layer 932 is formed in the semiconductor layer 921', wherein the Schottky semiconductor layer 932 and the Schottky metal layer 931 form a Schottky contact. The Schottky semiconductor layer 932 is in contact with a well 922 of an LDMOS device, wherein the well 922 has the first conductivity type. In this embodiment, as shown in the figure, the Schottky semiconductor layer 932 and the well 922 are formed by a same process step, and are in contact with each other in the channel direction and the vertical direction.

The two channel side body regions 934 have the second conductivity type, and are located at different sides out of the Schottky metal layer 931 respectively, wherein the two channel side body regions 934 are located in the Schottky semiconductor layer 932, and are separated by the Schottky channel 937. The Schottky channel 937 provides a current path in the SBD SD7, where an inversion current flows through when the SBD SD7 is conductive. The two channel side body regions 934 for example may be formed together with a body region having the second conductivity type of another device in the substrate 921 by a same process step. The two channel side body contacts 936 have the second conductivity type, and are located in the two channel side body regions 934 respectively, and are separated by the Schottky channel 937. The two channel side body contacts 936 for example may be formed together with a body contact having the second conductivity type of another device in the substrate 921 by a same process step.

The two gates 935 are located on the two channel side body regions 934 respectively. The gate 935 includes a dielectric layer 9351 in contact with the top surface, a conductive layer 9352 which is conductive, and a spacer layer 9353 which is electrically insulative. The conductive layer 9352 and the corresponding channel side body region 934 are separated by the corresponding dielectric layer 9351 or the spacer layer 9353. The two gates 935 for example may be formed together with a gate of another device in the substrate 921 a same process step.

Please refer to FIGS. 10A-10G and FIG. 2, which show a ninth embodiment of the present invention. FIGS. 10A-10G are schematics diagrams showing cross-section views of a manufacturing of the high voltage device 22. As show in FIG. 10A, first, the semiconductor layer 221' is formed on the substrate 221, wherein the semiconductor layer 221' has the top surface 221a and the bottom surface 221b opposite to the top surface 221a in the vertical direction (as indicated by the direction of a solid arrow shown in FIG. 10A). When the semiconductor layer 221' is just formed, the drift oxide region 224 and the isolation structures 233 have not been formed yet, and thus the top surface 221a has not been defined yet (the top surface 221a is indicated by a bold folded line shown in FIG. 10A). The substrate 221 is, for example but not limited to, a P-type or N-type silicon substrate. The semiconductor layer 221', for example, is formed on the substrate 221 by an epitaxial process step, or is a part of the substrate 221. The semiconductor layer 221' can be formed by various methods as known to a person having ordinary skill in the art, so the details thereof are not redundantly explained here.

Figure 10A:
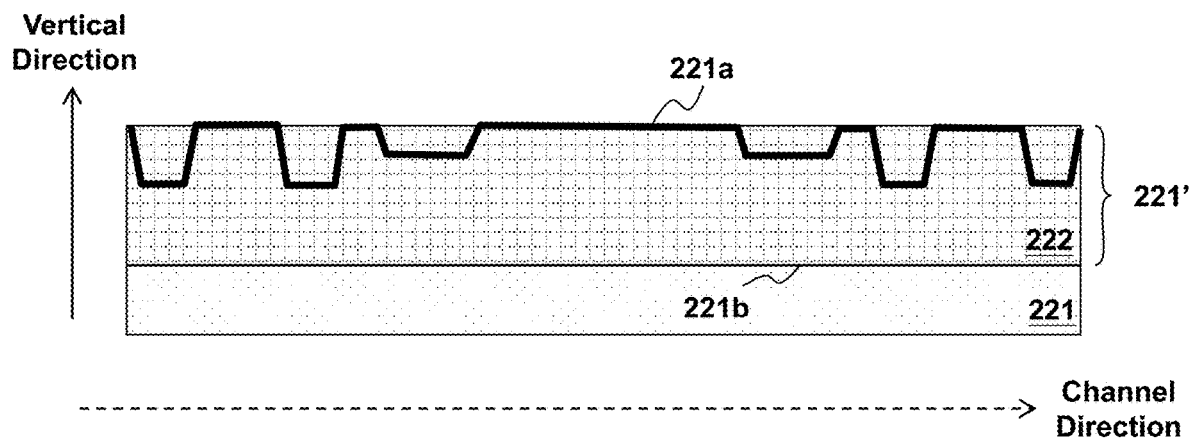

Still referring to FIG. 10A, the well 222 is formed for example by an implantation process step which implants impurities of the first conductivity type in the semiconductor layer 221'. The well 222 has the first conductivity type, and is formed in the semiconductor layer 221'. The well 222 is located beneath the top surface 221a and is in contact with the top surface 221a in the vertical direction. The well 222 may receive more implantation process steps later.

Next, referring to FIG. 10B, the drift oxide region 224 and the two isolation region 223 are formed on and in contact with the top surface 221a. The drift oxide region 224 is for example but not limited to a local oxidation of silicon (LOCOS) structure as shown in the figure, or may be a shallow trench isolation (STI) structure. The two isolation region 223 are for example but not limited to a shallow trench isolation (STI) structure as shown in the figure, or may be a local oxidation of silicon (LOCOS) structure. The drift oxide region 224 is formed on and in contact with the top surface 221a and is located on and in contact with part of a drift region 222a (as indicated by the dashed line frame in the LDMOS device shown in FIG. 2). The two isolation structures 233 are located outside two sides of the Schottky metal layer 231, and are on and in contact with the Schottky semiconductor layer 232, wherein the two isolation structures 233 are separated by a Schottky channel 234. The Schottky channel 234 provides a current path in the SBD SD, where an inversion current flows through when the SBD SD is conductive.

Figure 10C:
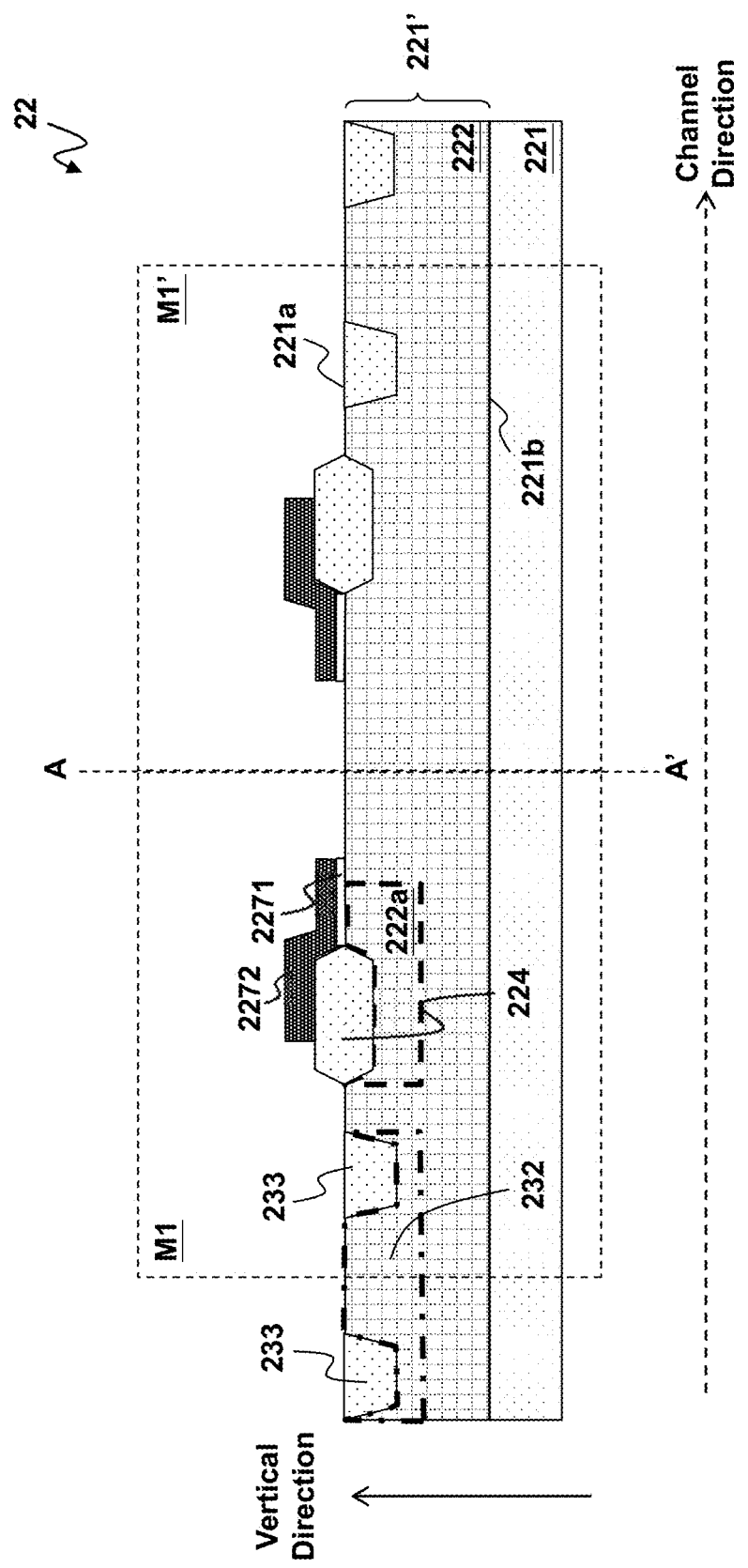

Next, referring to FIG. 10C, the dielectric layer 2271 and the conductive layer 2272 are formed on the top surface 221a of the semiconductor layer 221'. In the vertical direction (as indicated by the solid arrow in FIG. 10C), part of the body region 226 is located right below the dielectric layer 2271 and the conductive layer 2272 of the gate 227, and is in contact with the dielectric layer 2271 of the gate 227, to provide the inversion layer 223a of the LDMOS device LT in the ON operation.

Figure 10D:
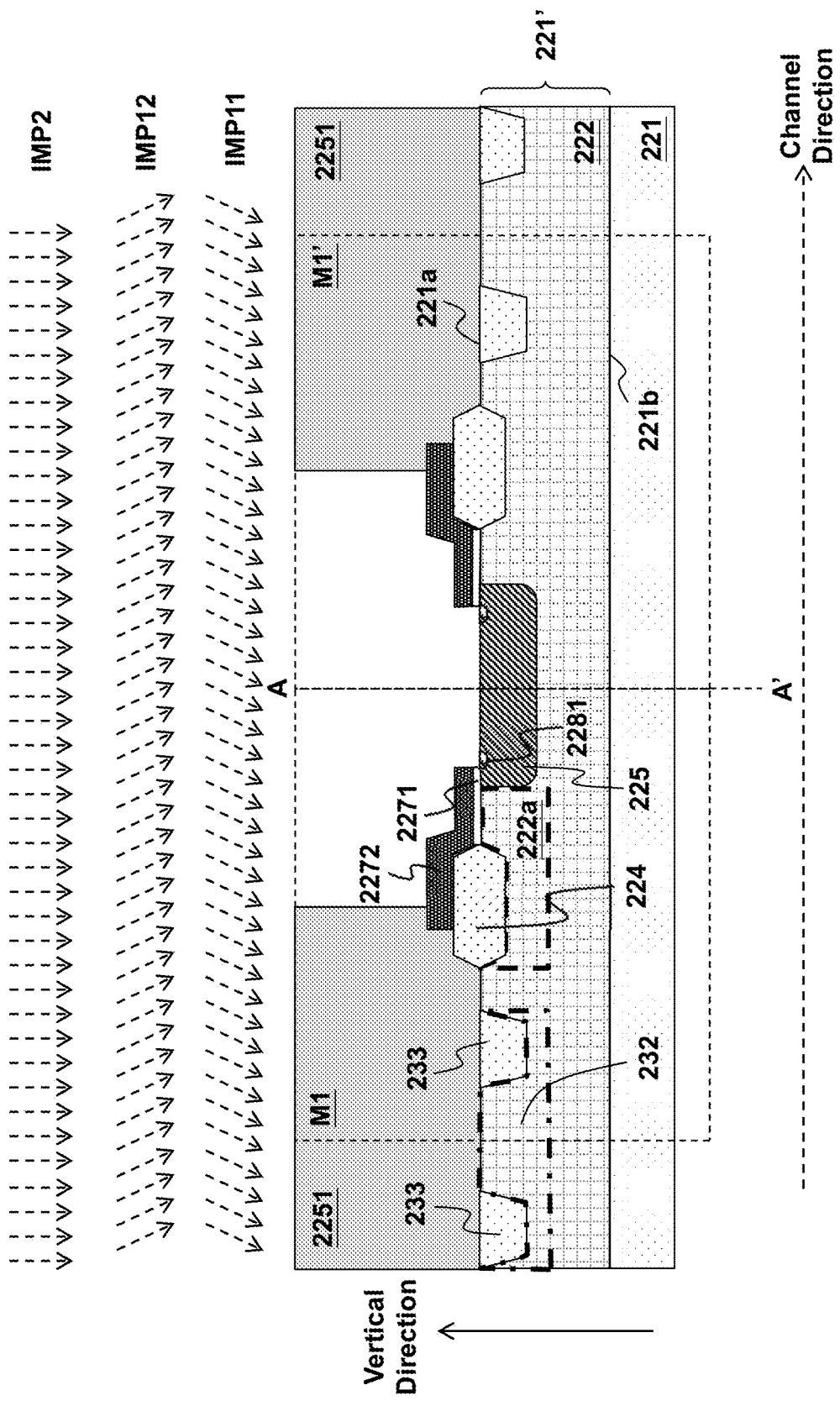

Next, referring to FIG. 10D, as shown in the figure, the body region 225 is formed in the well 222, and is located beneath and in contact with the top surface 221a in the vertical direction. The body region 225 has a second conductivity type. The body region 225 can be formed by, for example but not limited to, a lithography process step and an ion implantation process step, wherein the lithography process step includes forming a photo-resist layer 2251 as a mask, and the ion implantation process steps IMP11 and IMP12 implant second conductivity type impurities into the well 222 in the form of accelerated ions with tilt angles respectively, to form the body region 225.

Still referring to FIG. 10D, for example, a lightly doped region 2281 is formed after the dielectric layer 2271 and the conductive layer 2272 of the gate 227 are formed, wherein the lightly doped region 2281 is to assist forming a current flowing channel right below the spacer layer 2273 in the ON operation. The lightly doped region 2281 for example can be formed by an ion implantation process step IMP2, which implants first conductivity type impurities in the body region 225 in the form of accelerated ions, to form the lightly doped region 2281. Note that the first conductivity type impurity concentration of the lightly doped region 2281 is lower than that of the source 228 or the drain 229, and thus, the effect of the overlap regions of the lightly doped region 2281 with the source 228 and the drain 229 may be ignored.

Figure 10E:
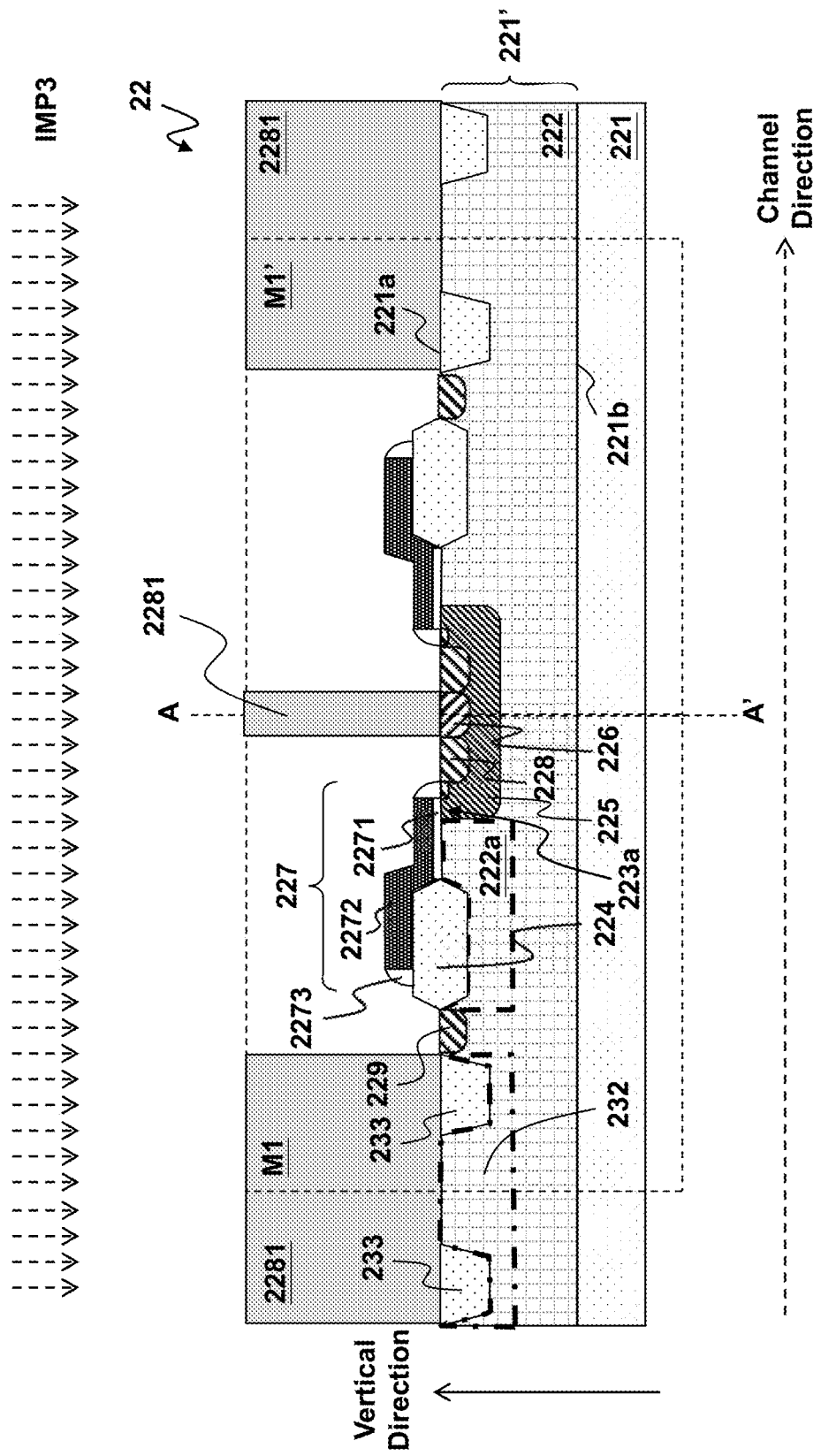

Next, referring to FIG. 10E, as shown in the figure, the spacer layer 2273 is formed outside the two sides of the conductive layer 2272, to form the gate 227. Next, the source 228 and the drain 229 are formed beneath the top surface 221a and in contact with the top surface 221a. The source 228 and the drain 229 are located at two different sides out of the gate 227 respectively, wherein the source 228 is located in the body region 226, and the drain 229 is located in the well 222 which is away from the body region 226. In the channel direction, the drift region 222a is located between the drain 229 and the body region 226, in contact with the top surface 221a in the well 222, as the channel for the drift current to flow through in the ON operation of the LDMOS device LT. The source 228 and the drain 229 are located beneath and in contact with the top surface 221a in the vertical direction, and have the first conductivity type. The source 228 and the drain 229 can be formed by, for example but not limited to, a lithography process step and an ion implantation process step IMP3, wherein the lithography process step includes forming a photo-resist layer 2281 as a mask, and the ion implantation process step IMP3 implants first conductivity type impurities into the body region 225 and well 222 in the form of accelerated ions, to form the source 228 and the drain 229 respectively.

Figure 10F:
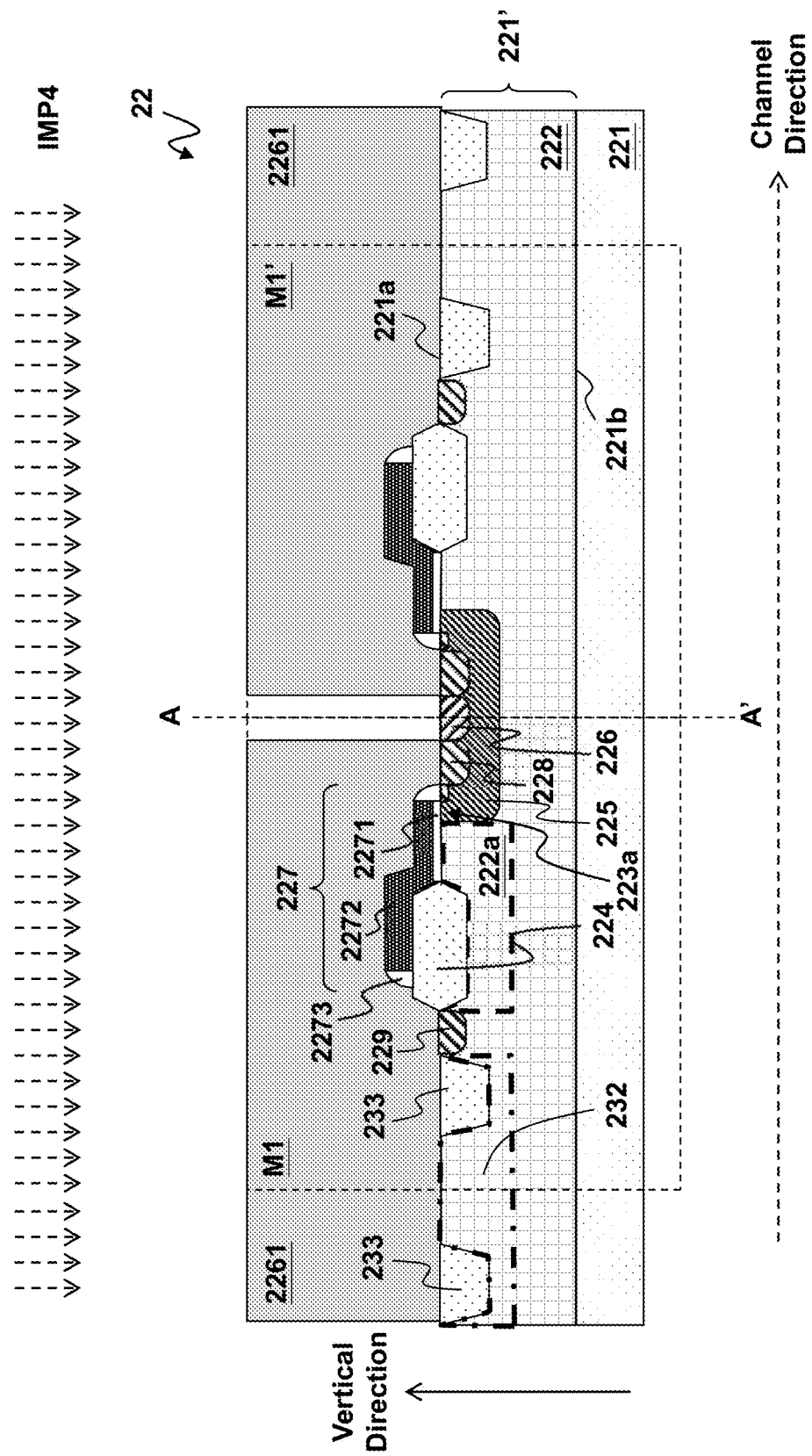

Next, referring to FIG. 10F, as shown in the figure, the body contact 226 is formed in the body region 225. The body contact 226 has the second conductivity type, and serves as an electrical contact of the body region 225. The body contact 226 is formed in the body region 225, beneath and in contact with the top surface 221a in the vertical direction. The body contact 226 can be formed by, for example but not limited to, a lithography process step and an ion implantation process step IMP4, wherein the lithography process step includes forming a photo-resist layer 2261 as a mask, and the ion implantation process step IMP4 implants second conductivity type impurities into the body region 225 in the form of accelerated ions, to form the body contact 226.

Figure 10G:
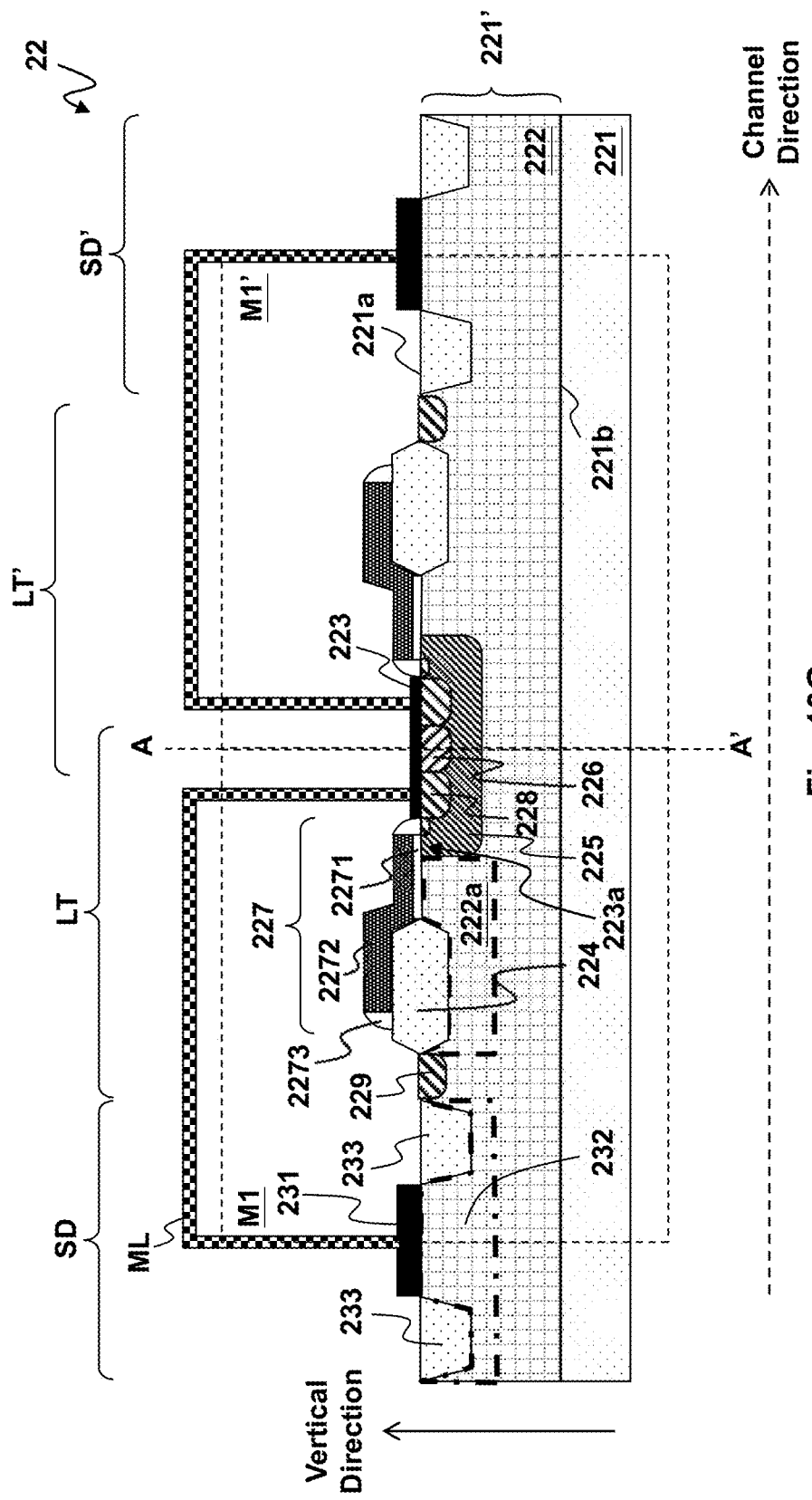

Next, referring to FIG. 10G, the Schottky barrier diode (SBD) SD is formed, which includes a Schottky metal layer 231 and a Schottky semiconductor layer 232. The Schottky metal layer 231 is formed on the semiconductor layer 221', and is on and in contact with the top surface 221a in the vertical direction. The Schottky metal layer 231 is electrically connected to the source 228 by a metal conductive line ML. The Schottky semiconductor layer 232 is formed in the semiconductor layer 221', wherein the Schottky semiconductor layer 232 and the Schottky metal layer 231 form a Schottky contact. The Schottky semiconductor layer 232 is in contact with the well 222, and is located beneath and in contact with the top surface 221a in the vertical direction. In this embodiment, as shown in the figure, the Schottky semiconductor layer 232 and the well 222 are formed by a same process step, and are in contact with each other in the channel direction and the vertical direction.

The two isolation structures 233 of the SBD SD are located outside two sides of the Schottky metal layer 231, and are on and in contact with the Schottky semiconductor layer 232, wherein the two isolation structures 233 are separated by a Schottky channel 234. The Schottky channel 234 provides a current path in the SBD SD, where an inversion current flows through when the SBD SD is conductive. The isolation structures 233 is for example but not limited to a shallow trench isolation (STI) structure as shown in the figure, or may be a local oxidation of silicon (LOCOS) structure. The isolation structures 233 and the drift oxide region 224 may be formed concurrently by a same process step.

The high voltage device 22 includes layout mirroring the basis unit M1 along the axis AA', wherein the basis unit M1 includes: at least part of the SBD SD; and at least part of the LDMOS device LT. In this embodiment, as shown in the figure, the SBD SD is divided into a left part and a right part. The basis unit M1 includes the right part of the SBD SD, and the left part of the SBD SD has a mirrored layout of the right part of the SBD SD. In this embodiment, as shown in the figure, the basis unit M1 includes the right part of the SBD SD, the complete drift oxide region 224, the complete gate 227, the complete source 228, the complete drain 229, a left part of the body region 225, and a left part of the body contact 226 of the LDMOS device LT. Another basis unit M1' has a mirrored layout of the basis unit M1. The high voltage device 22 is formed by mirroring the basis unit M1 to include two or more basis units, and can be extended by mirroring the mirrored layout. The basis unit M1' includes: at least part of the SBD SD' and at least part of the LDMOS device LT'. In this embodiment, the basis unit M1' is a rightward mirrored layout of the basis unit M1 along the axis AA', while in other embodiments, the basis unit M1 can be mirrored leftward to form another basis unit at the left side of the basis unit M1.

Note that, in this embodiment, in the LDMOS devices (including the LDMOS devices LT and LT'), all the wells 222 of are electrically connected to each other, and likely, all the body regions 225, all the body contacts 226, all the gates 227, all the sources 228, and all the drain 229 of the LDMOS devices are respectively electrically connected to each other. In the SBDs (including the SBDs SD and SD'), all the Schottky metal layers 231 are electrically connected to each other, and all the Schottky semiconductor layers 232 are electrically connected to each other. In a preferable embodiment, in the LDMOS device LT, the source 228 and the body contact 226 are electrically connected by a metal silicide layer 223 as shown in the figure.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a deep well, may be added. For another example, the lithography technique is not limited to the mask technology but it can be electron beam lithography, immersion lithography, etc. For another example, the SBDs SD5, SD6, and SD7 may be used in any embodiment of the first embodiment to the fifth embodiment, and the ninth embodiment. Therefore, in the same spirit of the present invention, those skilled in the art can think of various equivalent variations and modifications, which should fall in the scope of the claims and the equivalents.

What is claimed is:

1. A high voltage device configured to be used as a low-side switch in a power stage of a switching regulator, the high voltage device comprising:
   at least one lateral diffused metal oxide semiconductor (LDMOS) device, wherein the LDMOS device includes:
      a well, which has a first conductivity type, and is formed in a semiconductor layer;
      a body region, which has a second conductivity type, and is formed in the well;
      a gate, which is formed on the well and is connected to the well; and
      a source and a drain, which have the first conductivity type, and are located at different sides out of the gate respectively, wherein the source is located in the body region, and the drain is located in the well; and
   at least one Schottky barrier diode (SBD), wherein the SBD includes:
      a Schottky metal layer, which is formed on the semiconductor layer, and is electrically connected to the source; and
      a Schottky semiconductor layer, which is formed in the semiconductor layer, and is in contact with the well, wherein the Schottky semiconductor layer and the Schottky metal layer form a Schottky contact;
   wherein part of the body region, which is between a boundary thereof and the source, and is right below the gate, forms an inversion region which serves as an inversion current channel in an ON operation of the LDMOS device;
   wherein part of the well between the body region and the drain is a drift region, which serves as a drift current channel in the ON operation of the LDMOS device;
   wherein the SBD further includes two isolation structures, which are located outside two sides of the Schottky metal layer, and are on and in contact with the Schottky semiconductor layer, wherein the two isolation structures are separated by a Schottky channel;

wherein the SBD further includes two channel side body regions, which have the second conductivity type, and are located at different sides out of the Schottky metal layer respectively, wherein the two channel side wells are located in the Schottky semiconductor layer, and are separated by the Schottky channel, wherein the two channel side body regions and the body region are formed by a same process step.

2. The high voltage device of claim 1, wherein the high voltage device includes layout mirroring a basis unit, wherein the basis unit includes:
at least part of the SBD; and
at least part of the LDMOS device.

3. The high voltage device of claim 2, wherein the high voltage device includes plural LDMOS devices and wherein the basis unit includes a power device string formed by parts of the plural LDMOS devices, wherein the plural parts of the LDMOS devices are arranged by mirrored layout and connected in series in a channel direction;
wherein the SBD is in contact with the power device string in the channel direction.

4. The high voltage device of claim 1, wherein the high voltage device includes plural LDMOS devices and wherein the high voltage device includes layout mirroring a basis unit, wherein the basis unit includes:
at least one of the SBD; and
parts of the plural LDMOS devices, which are arranged by mirrored layout and connected in series in a channel direction;
wherein a number of the SBD is not more than a number of the LDMOS devices in the high voltage device, and each SBD is located between the body region and the drain in one of the LDMOS devices, wherein the Schottky semiconductor layer is in contact with the drift region.

5. The high voltage device of claim 1, wherein the at least one SBD is located in an isolation region of the high voltage device, and the isolation region is located outside the at least one LDMOS device.

6. The high voltage device of claim 1, wherein the SBD further includes two channel side wells, which have the second conductivity type, and are located at different sides out of the Schottky metal layer respectively, wherein the two channel side wells are located in the Schottky semiconductor layer, and are separated by the Schottky channel.

7. The high voltage device of claim 1, wherein the SBD further includes two channel side body contacts, which have the second conductivity type, and are located in the two channel side body regions respectively, wherein the two channel side body contacts are separated by the Schottky channel.

8. The high voltage device of claim 1, wherein the SBD further includes two polysilicon layers, which are located on the two channel side body regions respectively, and the polysilicon layer and the corresponding channel side body region are separated by the corresponding isolation structure.

9. The high voltage device of claim 1, wherein the LDMOS device further includes a drift oxide region, which is formed on the drift region, wherein the drift oxide region includes a local oxidation of silicon (LOCOS) structure, a shallow trench isolation (STI) structure or a chemical vapor deposition (CVD) oxide structure.

10. A manufacturing method of a high voltage device, wherein the high voltage device is configured to be used as a low-side switch in a power stage of a switching regulator, the manufacturing method comprising:
forming at least one lateral diffused metal oxide semiconductor (LDMOS) device, by manufacturing steps including:
forming a well in a semiconductor layer, wherein the well has a first conductivity type;
forming a body region in the well, wherein the body region has a second conductivity type;
forming a gate on the well and in contact with the well; and
forming a source and a drain having the first conductivity, wherein the source and the drain are located at different sides out of the gate respectively, wherein the source is located in the body region, and the drain is located in the well; and
forming at least one Schottky barrier diode (SBD), by manufacturing steps including:
forming a Schottky metal layer on the semiconductor layer, wherein the Schottky metal layer is electrically connected to the source; and
forming a Schottky semiconductor layer in the semiconductor layer, wherein the Schottky semiconductor layer is in contact with the well, wherein the Schottky semiconductor layer and the Schottky metal layer form a Schottky contact;
wherein part of the body region, which is between a boundary thereof and the source, and is right below the gate, forms an inversion region which serves as an inversion current channel in an ON operation of the LDMOS device;
wherein part of the well between the body region and the drain is a drift region, which serves as a drift current channel in the ON operation of the LDMOS device;
wherein the manufacturing steps of the SBD further include: forming two isolation structures, which are located outside two sides of the Schottky metal layer, and are on and in contact with the Schottky semiconductor layer, wherein the two isolation structures are separated by a Schottky channel;
wherein the manufacturing steps of the SBD further include: forming two channel side body regions, which have the second conductivity type, and are located at different sides out of the Schottky metal layer respectively, wherein the two channel side wells are located in the Schottky semiconductor layer, and are separated by the Schottky channel, wherein the two channel side body regions and the body region are formed by a same process step.

11. The manufacturing method of claim 10, wherein the high voltage device includes layout mirroring a basis unit, wherein the basis unit includes:
at least part of the SBD; and
at least part of the LDMOS device.

12. The manufacturing method of claim 11, wherein the high voltage device includes plural LDMOS devices and wherein the basis unit includes a power device string formed by parts of the plural LDMOS devices, wherein the plural parts of the LDMOS devices are arranged by mirrored layout and connected in series in a channel direction;
wherein the SBD is in contact with the power device string in the channel direction.

13. The manufacturing method of claim 10, wherein the high voltage device includes plural LDMOS devices and wherein the high voltage device includes layout mirroring a basis unit, wherein the basis unit includes:
at least one of the SBD; and
parts of the plural LDMOS devices, which are arranged by mirrored layout and connected in series in a channel direction; wherein a number of the SBD is not more than a number of the LDMOS devices in the high voltage device, and each SBD is located between the body region and the drain in one of the LDMOS devices, wherein the Schottky semiconductor layer is in contact with the drift region.

14. The manufacturing method of claim 10, wherein the at least one SBD is located in an isolation region of the high voltage device, and the isolation region is located outside the at least one LDMOS device.

15. The manufacturing method of claim 10, wherein the manufacturing steps of the SBD further include: forming two channel side wells, which have the second conductivity type, and are located at different sides out of the Schottky metal layer respectively, wherein the two channel side wells are located in the Schottky semiconductor layer, and are separated by the Schottky channel.

16. The manufacturing method of claim 10, wherein the manufacturing steps of the SBD further include forming two channel side body contacts, which have the second conductivity type, and are located in the two channel side body regions respectively, wherein the two channel side body contacts are separated by the Schottky channel.

17. The manufacturing method of claim 10, wherein the manufacturing steps of the SBD further include forming two polysilicon layers, which are located on the two channel side body regions respectively, and the polysilicon layer and the corresponding channel side body region are separated by the corresponding isolation structure.

18. The manufacturing method of claim 10, further comprising forming a drift oxide region, which is formed on the drift region, wherein the drift oxide region includes a local oxidation of silicon (LOCOS) structure, a shallow trench isolation (STI) structure or a chemical vapor deposition (CVD) oxide structure.

* * * * *